US007969804B1

(12) United States Patent
Hirose et al.

(10) Patent No.: US 7,969,804 B1
(45) Date of Patent: Jun. 28, 2011

(54) MEMORY ARCHITECTURE HAVING A REFERENCE CURRENT GENERATOR THAT PROVIDES TWO REFERENCE CURRENTS

(75) Inventors: Ryan T. Hirose, Colorado Springs, CO (US); Fredrick Jenne, Sunnyvale, CA (US); Vijay Srinivasaraghavan, Colorado Springs, CO (US); Igor G. Kouznetsov, San Jose, CA (US); Paul Fredrick Ruths, Woodland Park, CO (US); Cristinel Zonte, Colorado Springs, CO (US); Bogdan Georgescu, Colorado Springs, CO (US); Leonard Vasile Gitlan, Colorado Springs, CO (US); James Paul Myers, Woodinville, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 42 days.

(21) Appl. No.: 12/343,617

(22) Filed: Dec. 24, 2008

Related U.S. Application Data

(60) Provisional application No. 61/099,193, filed on Sep. 22, 2008, provisional application No. 61/122,805, filed on Dec. 16, 2008.

(51) Int. Cl.
*G11C 7/00* (2006.01)
(52) U.S. Cl. ... 365/206; 365/207; 365/208; 365/189.06; 365/210
(58) Field of Classification Search .................. 365/206, 365/207, 208, 189.06, 210
See application file for complete search history.

(56) References Cited

U.S. PATENT DOCUMENTS

| 5,592,419 | A | 1/1997 | Akaogi et al. |
| 5,901,084 | A | 5/1999 | Ohnakado |
| 6,188,613 | B1 | 2/2001 | Manning |
| 6,240,027 | B1 | 5/2001 | Lee et al. |
| 6,259,627 | B1 | 7/2001 | Wong |
| 6,359,947 | B1 | 3/2002 | Rao |
| 6,480,018 | B2 * | 11/2002 | Ra ............................ 324/762.09 |
| 6,498,757 | B2 * | 12/2002 | Kuo et al. ...................... 365/207 |
| 6,535,428 | B2 * | 3/2003 | Pasotti et al. ............. 365/185.21 |
| 6,798,250 | B1 * | 9/2004 | Wile ............................... 327/51 |
| 6,944,058 | B2 | 9/2005 | Wong |
| 6,999,365 | B2 | 2/2006 | Takano et al. |
| 7,050,343 | B2 | 5/2006 | Kumar et al. |
| 7,149,645 | B2 | 12/2006 | Mangrulkar et al. |
| 7,151,695 | B2 | 12/2006 | Choy et al. |
| 7,542,060 | B2 | 6/2009 | Rashed et al. |
| 2006/0221678 | A1 * | 10/2006 | Bedeschi et al. ............... 365/163 |
| 2007/0103968 | A1 * | 5/2007 | Ooishi ........................... 365/158 |
| 2007/0297247 | A1 | 12/2007 | Hemink |

(Continued)

OTHER PUBLICATIONS

International Search Report for International Application No. PCT/US09/57593 mailed Mar. 5, 2010; 2 pages.

(Continued)

*Primary Examiner* — Son Dinh

(57) ABSTRACT

A memory architecture is provided with an array of non-volatile memory cells arranged in rows and columns, and a sense amplifier coupled to at least one column within the array for sensing a data bit stored within one of the non-volatile memory cells. In order to provide accurate sensing, a reference current generator is provided and coupled to the sense amplifier. The reference current generator provides a first reference current having adjustable magnitude and adjustable slope, and a second reference current having adjustable magnitude, but constant slope. The first reference current is supplied to the sense amplifier for sensing the data bit. The second reference current is supplied to a control block for generating clock signals used to control sense amplifier timing.

18 Claims, 10 Drawing Sheets

U.S. PATENT DOCUMENTS

2008/0224731 A1  9/2008  Speers et al.
2010/0074028 A1  3/2010  Hirose et al.

OTHER PUBLICATIONS

The Written Opinion of the International Searching Authority for International Application No. PCT/US09/57593 mailed Mar. 5, 2010; 5 pages.

USPTO Notice of Allowance for U.S. Appl. No. 12/207,104 dated Apr. 30, 2010; 7 pages.

U.S. Appl. No. 12/343,658: "Memory Architecture Having Two Independently Controlled Voltage Pumps," Hirose et al., filed Dec. 24, 2008; 51 pages.

USPTO Non-Final Rejection for U.S. Appl. No. 12/343,658 dated Aug. 9, 2010; 14 pages.

USPTO Non-Final Rejection for U.S. Appl. No. 12/343,658 dated Jan. 19, 2011; 18 pages.

* cited by examiner

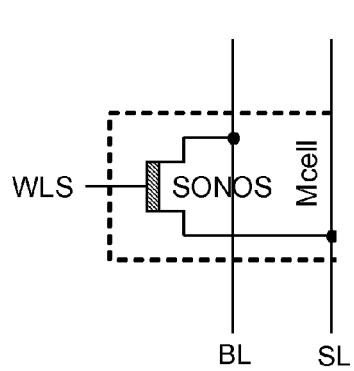
FIG. 2A
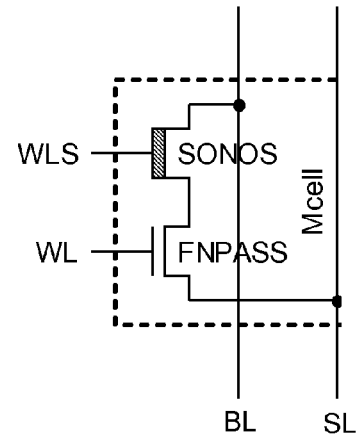
FIG. 2B
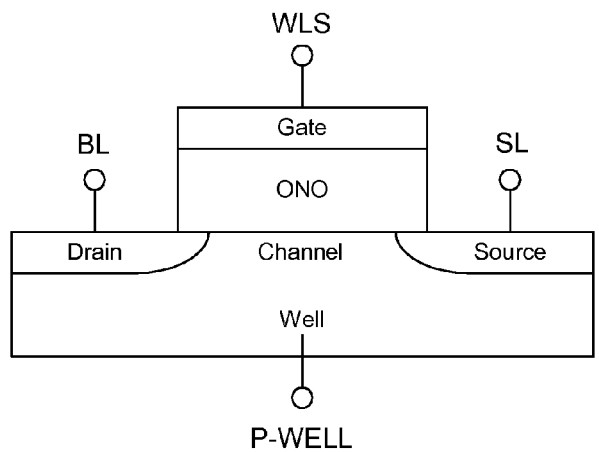
FIG. 3
|  | 1T | | | 2T | | |
|---|---|---|---|---|---|---|
|  | Read | Erase | Program | Read | Erase | Program |
| WL | NA | NA | NA | VPWR* / 0 | VPWR* / 0 | VWL* |
| WLS | 0 / -2* | VNEG / VPOS | VPOS / VNEG | 0 | VNEG / VPOS | VPOS / VNEG |
| BL | VLIM / 0 | VPOS | VNEG / VBL* | VLIM / 0 | VPOS | VNEG / VBL* |
| SL | 0 | VPOS* | VNEG / VBL* | 0 | VPOS* | VNEG / VBL* |
| P - Well | -2* | VPOS | VNEG | 0 | VPOS | VNEG |
FIG. 4

US 7,969,804 B1

MEMORY ARCHITECTURE HAVING A REFERENCE CURRENT GENERATOR THAT PROVIDES TWO REFERENCE CURRENTS

PRIORITY CLAIM

The present application claims priority to U.S. Provisional Application No. 61/099,193 filed Sep. 22, 2008 and U.S. Provisional Application No. 61/122,805 filed Dec. 16, 2008.

TECHNICAL FIELD

This application relates to memory architectures and, more particularly, to memory architectures including non-volatile (NV) memory cells.

BACKGROUND

The following descriptions and examples are given as background only.

Programmable non-volatile memories (NVM) are useful in many applications because they retain stored information even when power is removed from the memory. There are many different types of programmable non-volatile memory including, but not limited to, programmable read only memory (PROM), electrically erasable ROM (EEPROM) and Flash memory. These memory types have several methods of charge storage including but not limited to placing charge on a Floating Gate or Silicon-Oxide-Nitride-Oxide-Silicon (SONOS) storage material or node. Like other types of memory, programmable NVMs are usually constructed as an array of bit cells arranged in rows and columns. Each bit cell may include one or two transistors (i.e., 1T or 2T cells). During programming, charge is injected into the storage node of one of the transistors. The injected charge remains in the storage node until the bit cell is erased.

Flash memory is a type of non-volatile memory, which uses a floating-gate bit cell structure. The bit cell includes at least one transistor (i.e., the floating gate transistor), which has both a control gate and a floating gate. The control gate is used to properly bias the transistor for reading, programming and erasing, while the floating gate is used as the storage node of the bit cell. The floating gate is arranged between the channel and control gate of the transistor. The floating gate is typically separated from the channel by a thin tunnel oxide and separated from the control gate by an Oxide-Nitride-Oxide (ONO) dielectric layer. The bit cell is programmed by applying charge to the floating gate, and erased by removing charge from the floating gate while the control gate is properly biased. During programming modes, charge is injected from the channel to the floating gate through the tunnel oxide. The method of injection may be through direct Fowler-Nordheim (FN) tunneling or Channel Hot Electron Injection (CHEI). Erasing is typically achieved by FN tunneling of the charge from the channel to the floating gate.

Interest in SONOS has increased in recent years because the scalability of floating gate NVM technology is reaching its limits. One of the challenges stems from isolating the floating gate from surrounding layers. When device dimensions shrink, the insulating layers surrounding the gate also shrink. This leads to increased capacitive coupling between memory bits and greater likelihood of small "pinhole" manufacturing defects in the insulating layers, creating a discharge path. The second challenge that arises from shrinking dimensions is the increasing mismatch between the voltage used to cause tunneling and the normal circuit operating voltage. As lithography shrinks, circuits operate at lower voltages to avoid damage, but the voltage used to induce tunneling does not drop proportionately. This makes it increasingly difficult to integrate erase and write circuitry into the rest of the memory device. The voltage mismatch also increases the likelihood of long term damage to the floating gate transistor with each write/erase cycle, an effect known as "wear out."

SUMMARY

The following description of various embodiments of memory architectures and methods is not to be construed in any way as limiting the subject matter of the appended claims.

According to an embodiment, a memory architecture may include an array of non-volatile memory cells arranged in rows and columns, and a sense amplifier coupled to at least one column within the array for sensing a data bit stored within one of the non-volatile memory cells. In order to provide accurate sensing, a reference current generator is provided and coupled to the sense amplifier. The reference current generator provides a first reference current having adjustable magnitude and adjustable slope, and a second reference current having adjustable magnitude, but constant slope. The first reference current is supplied to the sense amplifier for sensing the data bit. The second reference current is supplied to a control block for generating clock signals used to control sense amplifier timing.

BRIEF DESCRIPTION OF THE DRAWINGS

FIG. 2A is a circuit schematic depicting an embodiment of a 1T SONOS memory cell that may be included in the NV memory array of FIG. 1.

FIG. 2B is a circuit schematic depicting an embodiment of a 2T SONOS memory cell that may be included in the NV memory array of FIG. 1.

FIG. 3 is a cross-section depicting an embodiment of an N-type SONOS transistor included within a 1T or 2T SONOS memory cell, according to an embodiment.

FIG. 4 is a table depicting bias voltages that may be used for reading, erasing and programming 1T and 2T SONOS memory cells, according to an embodiment.

DETAILED DESCRIPTION

In embodiments discussed herein, SONOS is a non-volatile, trapped charge semiconductor memory technology that provides immunity from single-point failures (caused, e.g., by "pinhole" defects) and lower programming voltages. In contrast to floating-gate devices, which store charge on a conductive gate, SONOS devices trap charge in a "charge trapping" layer included within a stack of dielectric layers. The dielectric stack (often referred to as an ONO stack) includes a thin tunneling layer (typically, an oxide) above the channel, a charge-trapping layer (typically, a nitride) above the tunneling layer and a blocking layer (typically, an oxide) between the charge-trapping layer and the control gate. The charge trap layer of the SONOS transistor is used as the storage node for the bit cell. The traps in the nitride layer capture electrons injected from the channel and retain the charge. This storage mechanism is less sensitive to "pinhole" defects, and thus, is robust for data retention.

A SONOS transistor may be programmed or erased by applying a voltage of the proper polarity, magnitude and duration to the control gate. A positive voltage causes electrons to tunnel from the channel to the charge trapping layer of the ONO stack. The trapped charge results in an energy barrier between the transistor drain and source, which raises the threshold voltage ($V_t$) of the SONOS transistor, causing data to be stored within the memory cell. A negative voltage removes the trapped charge from the charge trapping layer to lower the threshold voltage ($V_t$) of the SONOS transistor and erase the contents of the memory cell. Once programmed or erased, the contents of a SONOS memory cell may be read by applying nominal voltages to a particular combination of word and select lines, and sensing whether or not current is flowing on a corresponding bit line.

A memory architecture is disclosed, in embodiments, that controls the manner in which non-volatile memory cells are programmed, erased and read. The non-volatile memory architecture may include 1T or 2T memory cells implemented with EEPROM or Flash memory devices using SONOS technology.

Figure 1:
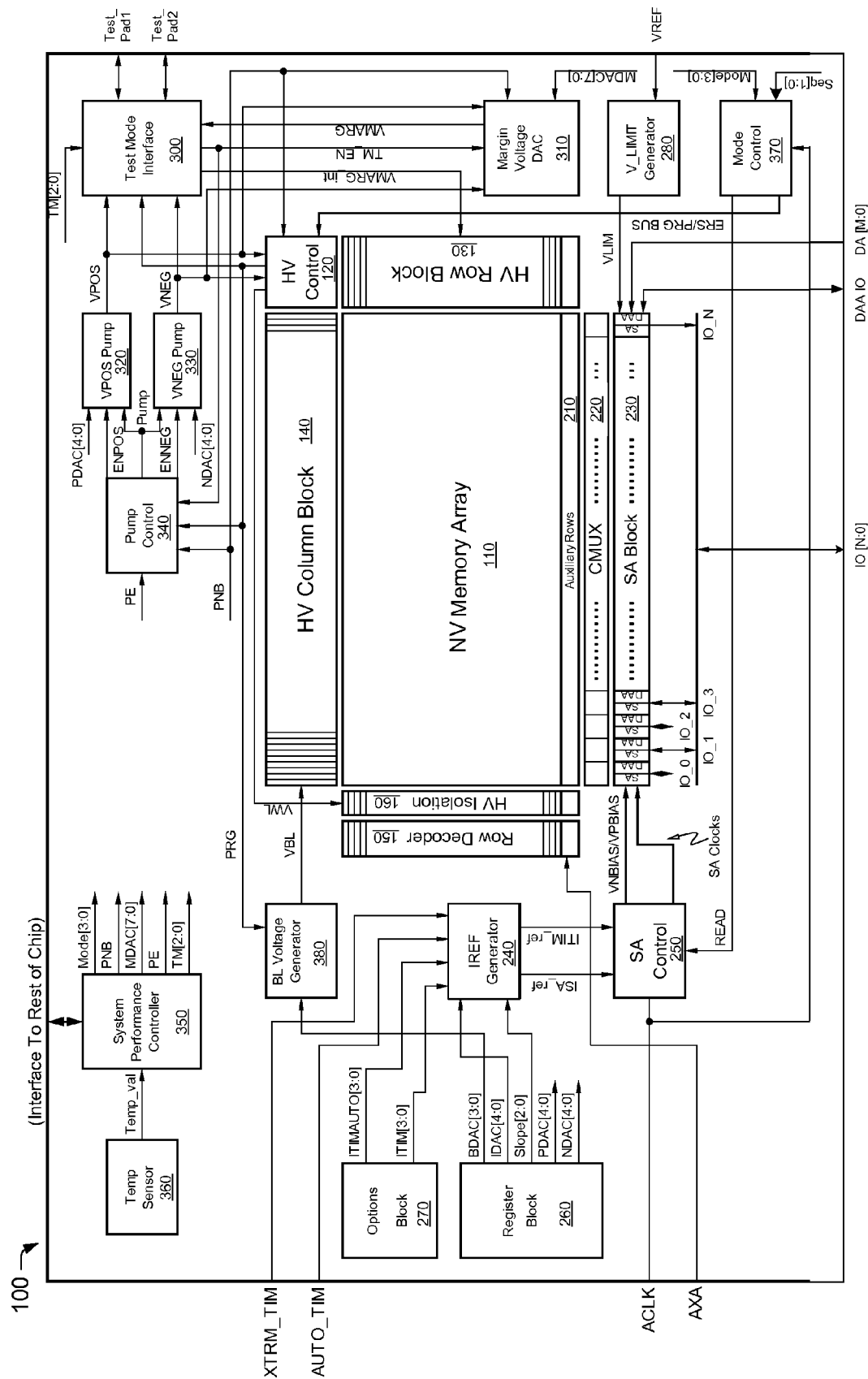
FIG. 1 is a block diagram depicting a non-volatile (NV) memory architecture in accordance with an embodiment of the present invention.

FIG. 1 is a block diagram depicting a non-volatile memory architecture (100) in accordance with an embodiment of the present invention. As shown in FIG. 1, the memory architecture may generally include an array (110) of programmable non-volatile memory cells and various circuits and components for controlling the manner in which the non-volatile memory cells are programmed, erased and read. Embodiments of the memory architecture will be described herein using SONOS devices developed, for example, in accordance with Cypress Semiconductor's 130 nm SONOS process technology. However, other embodiments of the invention are not so limited and may include substantially any type of memory cell developed in accordance with substantially any non-volatile process technology.

Non-volatile memory array (110) includes a plurality of memory cells arranged in rows and columns. Each memory cell may include one (1T) or two (2T) transistors. An embodiment of a 1T SONOS memory cell is illustrated in FIG. 2A. The 1T memory cell shown in FIG. 2A includes an N-type SONOS transistor having gate, drain and source terminals (see, FIG. 3). The gate of the SONOS transistor is coupled for receiving a SONOS word line (WLS) voltage, the drain is coupled for receiving a bit line (BL) voltage and the source is coupled for receiving a source line (SL) voltage. As shown in the cross-section of FIG. 3, the substrate or well of the SONOS transistor is coupled for receiving a well bias voltage (P-WELL). Exemplary voltages for reading, erasing and programming a 1T SONOS memory cell are shown in FIG. 4 and discussed in more detail below.

An embodiment of a 2T SONOS memory cell is illustrated in FIG. 2B. The 2T memory cell shown in FIG. 2B includes an N-type SONOS transistor and an N-type pass device (FN-PASS). As described in more detail below, the pass device may be included to minimize leakage currents during read operations. The SONOS gate is coupled for receiving the SONOS word line (WLS) voltage, while the drain is coupled for receiving the bit line (BL) voltage. The source of the SONOS transistor is coupled to the drain of the FNPASS device. The gate of the FNPASS device is coupled for receiving the word line (WL) voltage, while the source is coupled for receiving the source line (SL) voltage. The SONOS and FNPASS devices share a common substrate connection. Like the 1T cell, a well bias voltage (P-WELL) is supplied to the substrate of the SONOS and FNPASS devices to facilitate read, erase and program operations. Exemplary voltages for reading, erasing and programming a 2T SONOS memory cell are shown in FIG. 4 and discussed in more detail below.

FIG. 3 is a cross-section illustrating an embodiment of an N-type SONOS transistor. Although N-type devices are shown in the Drawings, the memory architecture described herein is not so limited and may include P-type devices in other embodiments. A skilled artisan would understand how the memory architecture could be modified to accommodate such devices.

As shown in FIG. 3, the gate of the SONOS transistor is separated from the channel by a stack of dielectric layers. The dielectric stack (often referred to as an "ONO stack") may include a thin tunneling layer (typically, an oxide) above the channel, a charge-trapping layer (typically, a nitride) above the tunneling layer, and a blocking layer (typically, an oxide) between the charge-trapping layer and the gate. The charge trapping layer of the SONOS transistor is the storage node for the 1T and 2T memory cells shown, e.g., in FIGS. 2A and 2B. As described below, the charge trapping layer may be "charged" to alter the threshold voltage ($V_t$) of the SONOS transistor and change the value of the bit stored within the 1T or 2T memory cell (e.g., to a "0" or "1"). The threshold voltage ($V_t$) is defined as the threshold gate-source voltage for current to flow through the SONOS transistor.

A SONOS memory cell in accordance with the present invention may be programmed or erased by applying a voltage of the proper polarity, magnitude and duration between the gate terminal and the source/drain/substrate terminals of the SONOS transistor. This voltage is referred to as the gate-to-channel voltage. For example, a SONOS memory cell can be programmed by raising the gate-to-channel voltage of the SONOS transistor to a relatively high positive value (typically between 8V and 12V). This causes electrons to tunnel from the channel to the ONO stack, where they become trapped in the charge trapping nitride layer. The trapped charge produces an energy barrier between the transistor drain and source, which raises the threshold voltage ($V_t$) of the SONOS transistor. In one embodiment, a "1" bit may be stored within the memory cell by raising the threshold voltage of a programmed SONOS transistor to a substantially positive (or alternatively, a slightly negative) $V_t$. The electrons trapped within the nitride layer can be removed by applying a negative gate-to-channel voltage (typically between –8V and –12V) to the SONOS transistor, thereby lowering the threshold voltage of the SONOS transistor and erasing the contents of the memory cell. In one embodiment, an erased SONOS transistor with a substantially negative $V_t$ may be used to store a "0" bit within the memory cell. Once programmed or erased, the contents of the SONOS memory cell may be read by applying nominal voltages to a particular combination of word, bit and source lines, and sensing whether or not current is flowing on the corresponding bit line.

An exemplary bias voltage scheme for reading, erasing and programming 1T and 2T SONOS memory cells is shown in FIG. 4. Some of the bias voltages shown in FIG. 4 include two entries separated by a slash (/). If two entries are included, the first entry corresponds to a "select bias" and the second entry corresponds to a "de-select bias." In some embodiments, the non-volatile memory array (110) may be partitioned into multiple "blocks" and/or multiple "sectors." Embodiments of a block architecture and a sector architecture are provided in FIGS. 5-6 and discussed in more detail below. However, the block and sector architectures shown in FIGS. 5-6 may not be utilized in all embodiments of the invention.

If a block or sector architecture is used, the select and de-select biases shown in FIG. 4 may be applied to enabled block(s) or sector(s). Disabled blocks or sectors may also receive a de-select signal (typically 0V), with the exception of the WL in the 2T cell block architecture (since the WL spans across multiple blocks, a WL may not be disabled if it is connected to an accessed memory cell in an enabled block). If the memory array is not partitioned into blocks or sectors, the select and de-select biases shown in FIG. 4 are applied to the entire memory array. Some of the bias voltages shown in FIG. 4 are denoted with an asterisk (*). These bias voltages are exemplary and may differ in other embodiments of the invention. For example, instead of shorting the SL to the BL during program and erase, the SL may be floated.

As shown in FIG. 4, 1T and 2T SONOS memory cells may be read by applying a bias (VLIM) to the bit line (BL), while grounding the source line (SL) and SONOS word line (WLS) of selected memory cell(s). The word line (WL) of a selected 2T cell may also receive an appropriate voltage bias during read operations. This enables current to flow (or not flow) on the bit line, depending on the threshold voltage ($V_t$) of the SONOS device. As described in more detail below, bit line currents may be sensed or "read" by a sense amplifier (230, FIG. 1). In one embodiment, a current value close to zero may indicate the presence of a "1" bit, whereas a substantially higher current value may indicate the presence of a "0" bit in the selected cell. The opposite may be true in alternative embodiments of the invention.

As shown in FIG. 4, the bias (VLIM) applied to selected BLs during read operations is limited to avoid disturbing other cells on the same BL. In one embodiment, a VLIM of about 1.2V may be provided by a V_LIMIT generator (280, FIG. 1). An embodiment of a V_LIMIT generator will be discussed in more detail below in reference to FIG. 9. As shown in FIG. 4, a power supply voltage (VPWR) is supplied to the WL of selected 2T cells to activate the N-channel FNPASS devices during read operations. In one embodiment, a power supply voltage of about 1.6V may be supplied to the WL of selected 2T cells. In other embodiments, read currents may be increased by supplying a pumped bias above the power supply level to the WL of selected 2T cells. It is noted, however, that the read bias voltages shown in FIG. 4 and discussed herein are exemplary and should not be considered to limit the invention.

In some embodiments, select/de-select biases (e.g., 1.2V/ 0V) may be applied to the BLs of the 1T and 2T memory cells, as well as the word line (WL) connected to the pass device (FNPASS) within the 2T cell. A select/de-select bias (e.g., 0V/–2V) may also be applied to the WLS line of the 1T cell to select/de-select the cells during read operations. The select/ de-select bias may be used on the WLS line of the 1T cell, because it does not have a pass device. As shown in FIG. 4, the read bias supplied to the P-well may be different for 1T and 2T cells. In one embodiment, 0V may be applied to the substrate of the 2T cell. However, a slightly negative bias (e.g., –2V) may be applied to the substrate of a 1T cell. The negative bias applied to the P-well results in a 0V gate-to-channel voltage for de-selected memory cells. It is noted, however, that the read bias voltages mentioned herein are exemplary and may differ in other embodiments of the invention.

As shown in FIG. 4, 1T SONOS memory cells may be erased by applying a negative voltage (VNEG) to the SONOS word line (WLS) and a positive voltage (VPOS) to the bit lines (BL), source lines (SL) and substrate (P-Well) of targeted or "selected" memory cells. The SONOS word line (WLS) of unselected memory cells within the enabled block or sector is biased with VPOS to avoid erasing memory cells on unselected rows.

A similar biasing scheme is shown in FIG. 4 for erasing 2T SONOS memory cells. However, the 2T scheme differs from the 1T scheme by applying a select/de-select bias to the word lines (WL) connected to the pass device (FNPASS) in the 2T cell. In one embodiment, VPWR may be applied to a selected WL, while 0V is applied to all de-selected WLs. The select/ de-select biases applied to the WLs during erase may be generated, for example, by Row Decoder (150).

As shown in FIG. 4, 1T SONOS memory cells may be programmed by applying a positive voltage (VPOS) to the SONOS word line (WLS) and a negative voltage (VNEG) to the bit lines (BL), source lines (SL) and substrate (P-Well) of selected memory cells. The SONOS word line (WLS) of unselected memory cells within the enabled block or sector is biased with VNEG to avoid programming memory cells on unselected rows.

In some embodiments, the BL and SL of unselected memory cells may be biased (VBL) to avoid programming memory cells, which are to be left in the erased state. As described in more detail below, a VBL bias between 0V and VPWR may be used to inhibit programming of certain cells. In one embodiment, a VBL of about 1V may be provided by a BL Voltage generator (380, FIG. 1). An embodiment of a BL Voltage generator will be discussed in more detail below in reference to FIG. 7.

A similar biasing scheme is shown in FIG. 4 for programming 2T SONOS memory cells. However, the 2T scheme differs from the 1T scheme by applying a VWL bias (typically between 0V and VNEG) to the word line (WL) of all 2T cells to reduce HV damage to the SONOS device during program operations. In one embodiment, a VWL bias of about 0V may be supplied to the WL of all 2T cells by a WL Voltage generator (associated, e.g., with HV control block 120). An embodiment of a WL Voltage generator will be discussed in more detail below in reference to FIG. 8.

As shown in FIG. 4, a SONOS memory cell in accordance with the present invention may be programmed and erased by applying positive (VPOS) and negative (VNEG) voltages to the gate, drain, source and substrate terminals of the SONOS transistor. This enables relatively high program and erase voltages to be applied as a sum of smaller voltages. In particular, the voltage biasing scheme shown in FIGS. 2-4 applies a sum of the magnitudes of the VPOS and VNEG voltages to the SONOS transistor. In one embodiment, a VPOS of about 6V and a VNEG of about −4V may be applied to the terminals of the SONOS transistor to provide a +10V programming voltage or a −10V erase voltage. However, the memory architecture described herein is not so limited and may use a different combination of VPOS and VNEG voltages (e.g., 7V and −3V, respectively) to generate the programming and erase voltages mentioned above. In other embodiments, alternative VPOS and VNEG voltages may be used to generate alternative programming voltages (e.g., within a range of about +8V to about +12V) and alternative erase voltages (e.g., within a range of about −8V to about −12V). As described in more detail below, the VPOS and VNEG voltages are independently generated by a pair of voltage pump circuits (320, 330, FIG. 1). The use of dual voltage pump circuits enables the VPOS and VNEG voltages to be generated even in the midst of low power supply voltage (e.g., 1.6V).

Figure 5:
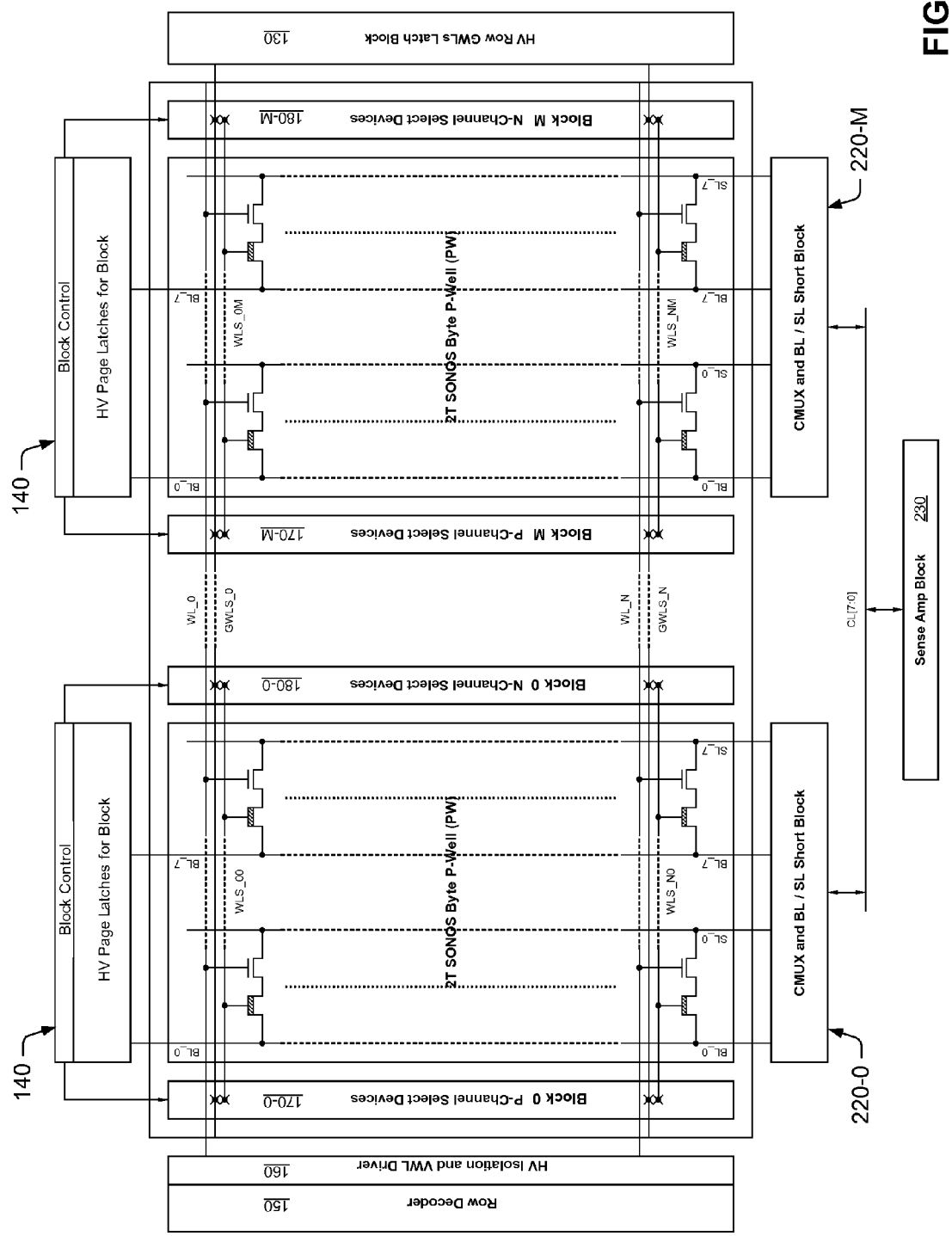
FIG. 5 is a block diagram depicting one manner in which a NV memory array comprising 2T memory cells may be partitioned into blocks, according to an embodiment.
Figure 6:
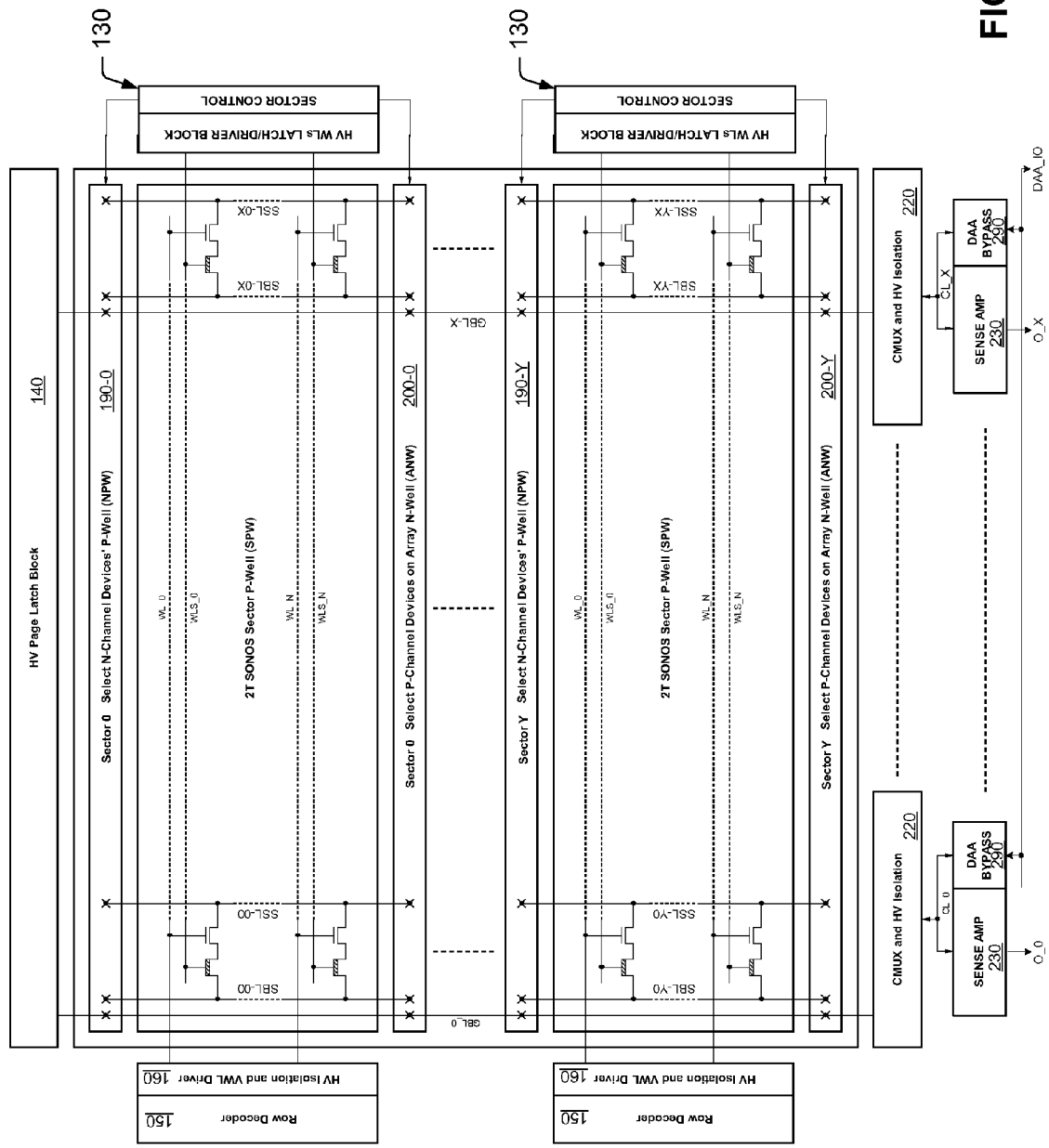
FIG. 6 is a block diagram depicting one manner in which the NV memory array comprising 2T memory cells may be partitioned into sectors, according to an embodiment.

The VPOS and VNEG voltages are routed through high voltage (HV) control (120), column (140) and row (130) blocks to the targeted 1T or 2T memory cells. HV signal routing is dependent on whether: i) erase or program, and ii) block, sector or bulk operations are being performed. For example, single block erase/program operations can be performed when columns of the memory array (110) are partitioned into a plurality of "blocks." In one embodiment, a "block" may contain multiple columns of memory cells, so that each row within a given "block" stores one byte (8-bits) of information. In another embodiment, a "block" may store more than one byte of information (e.g., a block may store a partial page of information, where a "page" is defined as an entire row of memory cells). If bulk operations are employed, multiple rows within a single block or multiple blocks of data may be programmed or erased at one time. In some cases, the rows of memory array (110) may be additionally or alternatively partitioned into a plurality of "sectors." Embodiments of block and sector architectures are shown in FIGS. 5 and 6, respectively. It should be noted, however, that the architectures shown in FIGS. 5 and 6 are exemplary and may not be utilized in all embodiments of the invention.

FIG. 5 illustrates one embodiment of a memory architecture in which multiple columns of 2T memory cells are partitioned into "blocks," so that each row within a given block stores one byte (8-bits) of information. Each column of memory cells is coupled between a corresponding bit line (e.g., BL_0) and a corresponding source line (e.g., SL_0). In the embodiment of FIG. 5, eight columns of memory cells are included within each block for storing one byte of information in each row. The exemplary memory architecture shown in FIG. 5 is partitioned into (M+1)-number of blocks.

In one embodiment, all transistors within a given block share a common substrate connection (e.g., a common P-well when N-type transistors are used). Within each block, the SONOS gates of adjacent memory cells along a given row are coupled to a local WLS line (e.g., WLS_00). Multiple bytes in separate P-wells along a given row may each have a separate local WLS line (e.g., WLS_00 to WLS_0M) that connects to a global WLS line (e.g., GWLS_0) associated with that row.

The block architecture shown in FIG. 5 enables a single byte of data to be programmed or erased at one time. To perform a byte erase/program operation, the select WLS biases shown in FIG. 4 are routed by the HV Row and GWLS latch block (130) to the GWLS line of a targeted row. However, a local WLS line (e.g., WLS_00) corresponding to the targeted row may only receive the GWLS bias if the P-channel and N-channel block select devices (170, 180) associated with a given block (e.g., block 0) are enabled. The appropriate block select devices (170, 180) are enabled through HV Column block (140). The HV Column block (140) is also responsible for routing the BL and P-well biases (shown in FIG. 4) to the selected block. In one embodiment (shown in FIG. 5), a BL/SL shorting block may be included within each CMUX (220) for shorting the SL to the BL of a selected block. In another embodiment, the BL/SL shorting block may be alternatively included within HV Column block (140). In yet another embodiment, the SL could be left floating.

Figure 7:
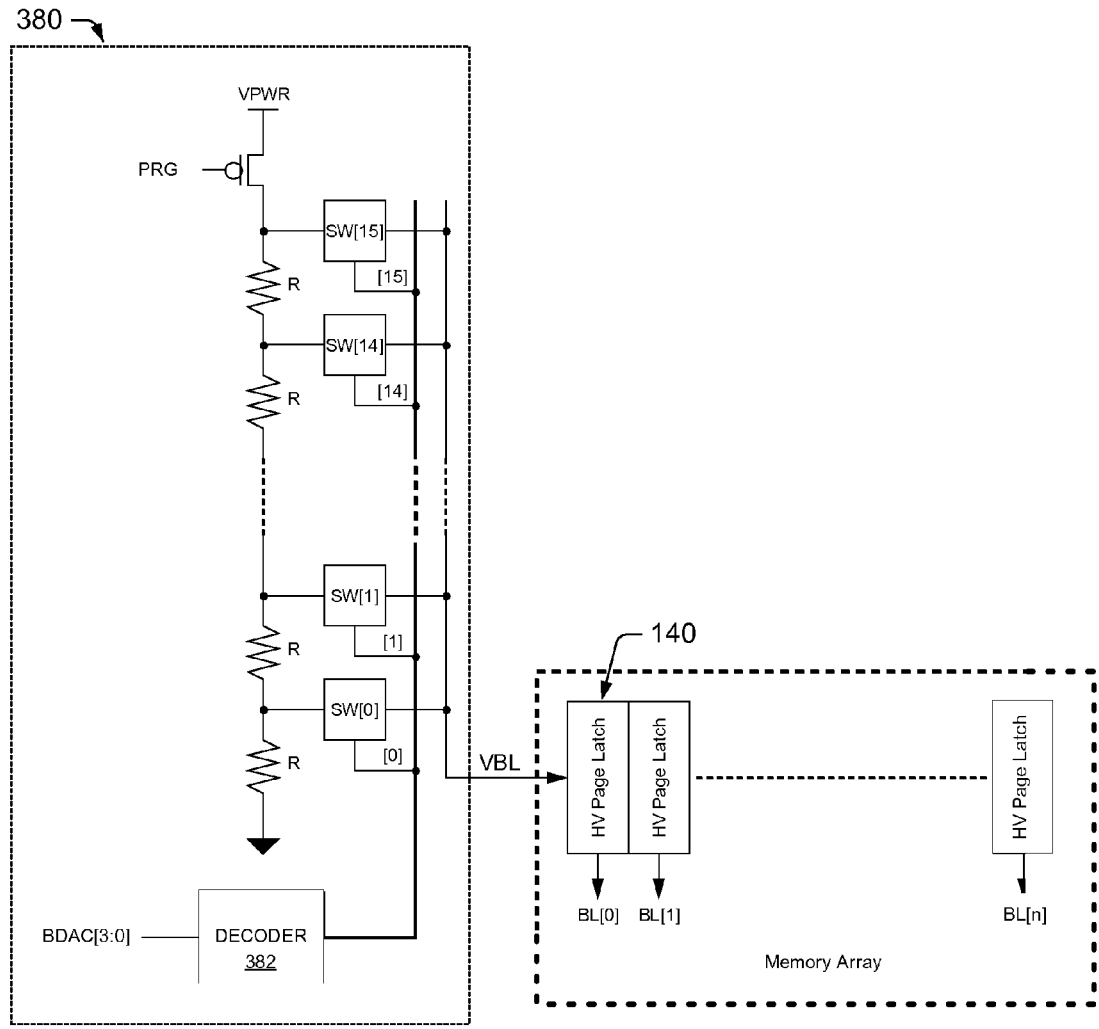
FIG. 7 is a circuit schematic depicting an embodiment of a BL voltage (VBL) generator that may be included in the NV memory architecture of FIG. 1.

Because the SONOS gates of adjacent memory cells along a row are coupled to the same local WLS line, program and erase operations affect the memory cells that are arranged along the same row and within the same P-well (or block). The architecture shown in FIG. 5 avoids programming and erasing other rows in the same P-well (or block) by applying the de-select WLS signal (e.g., VPOS or VNEG, as shown in FIG. 4) to the GWLS lines, and thus, to the WLS lines of all non-selected rows in the same selected P-Well. In addition, a voltage bias (VBL) may be supplied to unselected BLs and SLs to "inhibit" or avoid programming '0' data state memory cells in the same P-well (or block). An embodiment of a VBL generator is illustrated in FIG. 7 and described in more detail below.

Figure 8:
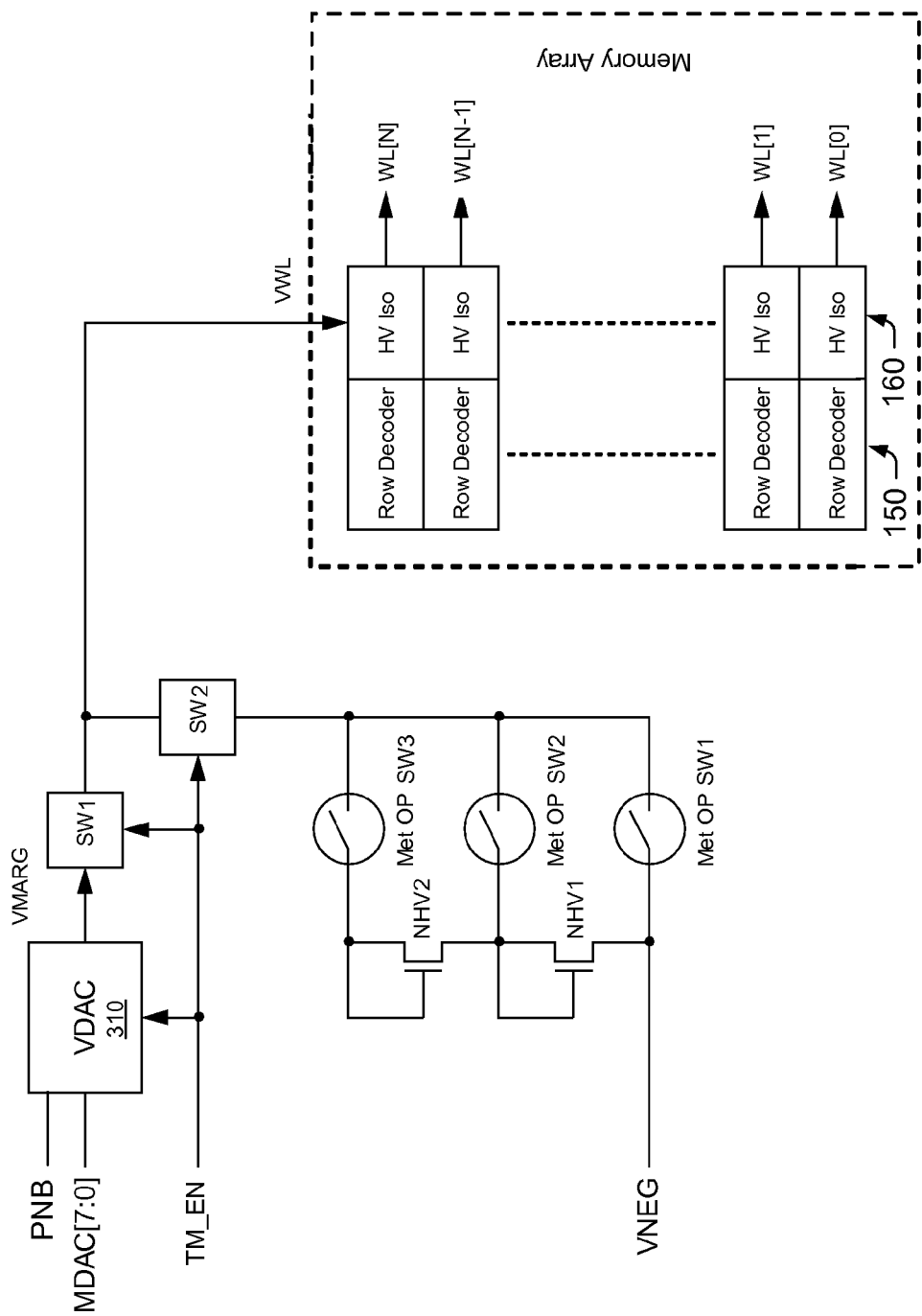
FIG. 8 is a circuit schematic depicting an embodiment of a WL voltage (VWL) generator that may be included in the NV memory architecture of FIG. 1.

As shown in FIG. 5, Row Decoder (150) and HV Isolation and VWL driver (160) are used in the 2T architecture for driving the word lines (WLs) connected to the gates of the pass transistors included within the 2T cell. The biases supplied to the WLs during program are generated by a word line voltage (VWL) generator associated with the HV control block (120). An embodiment of a VWL generator is illustrated in FIG. 8 and described in more detail below.

There are many benefits that arise from using a block architecture, such as the architecture shown in FIG. 5. These benefits include, but are not limited to, the ability to erase/program one byte (or more) at a time and confining the high voltages (HV) used during erase/program to only those blocks enabled for erase/program. Having the ability to erase/program one byte on a row gives true EEPROM byte alterable capability instead of the pseudo EEPROM functionality provided by a sector architecture (described below). To alter a byte in the sector architecture, the byte is written to HV page latches in HV Column Block (140). However, other bytes on the same row that are to be left unchanged (i.e., in the same data state) may be read out, written back into the HV page latches and then programmed into their previous locations. If there are ten bytes on a row, and each byte is erase/programmed ten times, each byte (and block) may be subjected to one-hundred erase/program HV cycles, instead of the ten cycles used in a block architecture. HV cycling may be very damaging to memory cells and HV circuitry, therefore, embodiments limit the number of HV cycles by an order of magnitude (or more).

FIG. 6 illustrates one embodiment of a memory architecture in which multiple rows of 2T memory cells are partitioned into "sectors." In the sector architecture, each column of memory cells is divided into multiple segments. Within each sector, the drain terminals of memory cells within a given column segment are connected to a local or segmented bit line (e.g., SBL_00). The source terminals of memory cells within a given column segment are connected to a local or segmented source line (e.g., SSL_0). Multiple SBLs arranged within a given column, but within separate sector P-wells, are connected to a common global bit line (e.g., GBL_0) parallel to the column.

A "sector" is defined herein to include multiple column segments arranged side by side in the same sector P-well. The exemplary memory architecture shown in FIG. 6 is partitioned into Y-number of sectors, each sector containing X column segments. In the sector architecture of FIG. 6, a whole row of memory cells may share the same word line (WL), SONOS word line (WLS) and P-Well (SPW) connection. This enables the sector architecture to program or erase a whole row (or page) of memory cells at one time. The page size is determined by the number of columns included within the sector. The number of pages per sector is determined by the number of memory cells included within each column segment.

The sector architecture shown in FIG. 6 enables a whole row of data to be programmed or erased at one time. To perform a sector program/erase operation, the WLS select biases shown in FIG. 4 are routed by the HV Row and WLS latch block (130) to the targeted row. The BL bias shown in FIG. 4 is applied to the global bit lines (e.g., GBL_0 to GBL_X) via the HV latches included within HV Column block (140). However, a local SBL (e.g., SBL_00) may only receive the GBL bias (e.g., GBL_0) if the P-channel and N-channel sector select devices (190, 200) associated with a given sector (e.g., sector 0) are enabled. The appropriate sector select devices (190, 200) are enabled through HV Row block (130). In one embodiment, the SL may be shorted to the BL within the P-channel and N-channel sector select devices (190, 200) during erase/program operations. During read operations, the SLs may receive read biases from a ground line running orthogonal to the SLs in 190 and 200. The P-Well biases from FIG. 4 are routed to the sectors by the Sector Control in HV Row block (130).

To avoid programming or erasing other rows in the same P-well, the de-select WLS bias shown in FIG. 4 may be applied to the WLS lines of all unselected rows in the sector. In addition, a voltage bias (VBL) may be supplied to unselected BLs and SLs (through corresponding GBL connections) to "inhibit" or avoid programming '0' data state memory cells in the same P-well (or sector). An embodiment of a VBL generator is illustrated in FIG. 7 and described in more detail below.

As shown in FIG. 6, Row Decoder (150) and HV Isolation and VWL driver (160) are used in the 2T architecture for driving the word lines (WLs) connected to the gates of the pass transistors included within the 2T cell. The biases supplied to the WLs during program and erase are generated by a word line voltage (VWL) generator associated with the HV control block (120). An embodiment of a VWL generator is illustrated in FIG. 8 and described in more detail below.

There are many benefits to utilizing a sector architecture. As noted above, the sector architecture divides each bit line into a plurality of local or segmented bit lines (SBLs). The use of segmented bit lines reduces bit line delays during read operations by reducing the parasitic load presented to the accessed memory cell. In the sector architecture, an accessed memory cell drives one SBL and the GBL connected to that SBL. Because SBLs in other sectors are disconnected from the GBL by the high voltage sector select devices (190, 200), they do not present a parasitic load to the accessed memory cell during reads. At the very least, the sector architecture shown in FIG. 6 may reduce parasitic loading by a factor of ½ (if only two sectors are used). Additional reduction may be achieved by dividing the array into more than two sectors.

In embodiments herein, the sector architecture may adjust the amount of leakage present on a local bit line (SBL) during a read operation, so that it is less likely to corrupt "1" data. For example, read currents should be close to zero whenever a "1" bit is being read. However, when read biases are applied to a selected column, leakage paths are created between the BL and SL (drain to source) of all unselected transistors in the column. Another leakage path exists from the selected BL to the common P-well through the drain node. In one embodiment, leakage is maximum when all of the unselected transistors in a selected column are in the "0" data state. Without the sector architecture, the amount of leakage in a selected column may approach the current level corresponding to "0" data state, causing an accessed memory cell storing "1" data to be misread as "0" data. By employing the sector architecture, the number of memory cells, and thus, the leakage on a selected SBL can be adjusted so that "1" data cannot be misread, regardless of the data state of the unselected cells on the same SBL. Because the leakage paths described herein are dependent on process, voltage and temperature (PVT), worst case PVT should be considered when choosing the number of memory cells to include on each SBL (i.e., the number of memory cells in each column segment of the sector).

In an embodiment, only the memory cells within the targeted sector may be subject to HV cycling damage. In other words, the sector architecture eliminates HV cycling of rows (or pages) outside of the targeted sector. This reduces memory cell "wear out" and extends the lifetime of the memory array. Memory cell wear out due to HV cycling within a particular sector can be reduced by limiting the number of rows included within each sector. To avoid HV cycling outside of the targeted sector, a de-select bias (e.g., 0V in the 2T scheme) may be placed on the WL, WLS, SBL and P-well of all de-selected sectors during program and erase.

In an embodiment, the size of the memory array is not limited due to the constraints of BL load, BL leakage or HV cycling. This enables many more rows to be included within the memory array for increased density.

As noted above, a voltage bias (VBL) may be supplied to unselected BLs and SLs to "inhibit" or avoid programming '0' data state memory cells in the same block or sector. For example, selected memory cells may be programmed with '1' data by applying VPOS to the SONOS gate and VNEG to the BL, SL and P-Well associated with the selected cell. This bias scheme forms a channel (at the VNEG potential) under the gate and SONOS layer of the selected memory cell. The direction and magnitude (e.g., +10V) of the bias scheme applied to selected memory cells causes electrons to tunnel from the channel to the nitride sub-layer of the SONOS device, driving the program threshold voltage (VTP) positive.

In order to inhibit or avoid programming '0' data state memory cells in the same P-well, VBL is applied to the BLs and SLs of all unselected columns to bias the channel region of all '0' data state memory cells with VBL. Although the bias applied to the channel region is still in the direction (i.e., +) used to program, the magnitude (e.g., ~5V) provided to all '0' data state memory cells is not enough to program those cells. This enables those memory cells to remain in the '0' data erase state with an erased (VTE) threshold. The VBL bias supplied to the '0' data state memory cells is typically a mid-level bias between VPOS and VNEG. However, since the VBL bias level used to inhibit '0' data state memory cells can vary with HV levels, process and other secondary factors, means for providing an adjustable VBL bias may be used.

FIG. 7 illustrates one embodiment of a VBL generator circuit (380) that may be used to provide an adjustable VBL bias to unselected BLs and SLs within a given block or sector. The VBL circuit shown in FIG. 7 uses a resistor chain to divide a supply range (e.g., 0V to VPWR) into sixteen possible values of VBL. A particular VBL value is chosen by supplying a BDAC [3:0] value to decoder 382. The BDAC [3:0] value may be stored within register block (260), as shown in FIG. 1. As shown in FIG. 7, decoder 382 decodes the BDAC [3:0] value into an enable signal (e.g., [0:15]), which is supplied to the 16 switches coupled to the chain. The enable signal activates only one of the switches, in an embodiment. The VBL value provided by the activated switch is routed through the HV page latches in the HV Column block (140) to the unselected BLs and SLs. In the illustrated embodiment, the VBL generator is enabled by supplying a programming (PRG) signal to the gate of a P-channel transistor coupled between VPWR and the resistor chain. The PRG signal may be provided by a Mode Control circuit (370), as discussed in more detail below.

In one embodiment, a VBL bias of about 1V may be supplied to the unselected BLs and SLs of a given block or sector during program operations. However, such a bias is exemplary and may be different in other embodiments of the invention. In any case, the VBL bias may be used to avoid programming '0' data state memory cells in the same block or sector.

As noted above, a VWL bias may be applied to the word line (WL) of all 2T cells to reduce HV damage to the SONOS device during program operations. For example, the high voltages supplied to selected memory cells during program operations may cause the source terminal of a SONOS transistor in an unselected programmed cell on a different row to be more positive than desired. This may cause the voltage threshold of an unselected programmed cell to drop below the minimum VTP level, changing the programmed "1" data to "0" data. Programming disturbs such as these may be eliminated by applying a VWL bias to the word line of all 2T cells. The VWL bias causes the source terminal of the SONOS transistor in an unselected cell to be more negative, eliminating the possibility of a disturb. The level of the VWL bias should be chosen to keep the VTP of an unselected programmed memory cell as high as possible during HV cycling. As described in more detail below, the VWL bias is generated by a WL Voltage generator and supplied to the WLs of all 2T cells by Row Decoder (150) and HV Isolation and VWL driver (160). The level of the VWL bias may range between 0V and the VNEG level.

FIG. 8 illustrates one embodiment of a WL Voltage generator that may be used to provide an adjustable VWL bias to the word line of all 2T cells. As noted above, the level of the VWL bias should be chosen to keep the VTP of an unselected programmed memory cell as high as possible during HV cycling. In one embodiment, a voltage digital to analog converter (VDAC) circuit (310) may be used to determine an appropriate VWL bias level. As discussed in more detail below, a negative margin mode may be enabled by supplying appropriate PNB signal (e.g., PNB=0) to the voltage margin DAC (VDAC 310). A test mode enable (TM_EN) signal enables the VDAC and allows margin voltages (VMARG) to be routed to the word lines (WL) of the memory array (110) through switch SW1, Row Decoder (150) and HV Isolation and VWL driver (160).

An appropriate VWL bias may be determined by supplying a range of VMARG voltages, set by MDAC [7:0], to the word lines (WLs) of the memory array while erase/program cycling is occurring to monitor the effect of VMARG on VTP (i.e., the SONOS programming $V_t$). As described in more detail below, a target VTP may be determined by performing an initial margin mode (MM) read. During margin modes, the output (VMARG) of the VDAC is applied to the SONOS word line (WLS), so that a resulting threshold voltage ($V_t$) of the SONOS device can be measured. Further description of MM reads is provided below. Once an appropriate VWL bias is determined (such that the target VTP is maintained or minimally disturbed), the VWL bias used to maintain the target VTP may be set by metal options and routed to the word lines through switch SW2, Row Decoder (150) and HV Isolation and VWL driver (160).

As shown in FIG. 8, the WL Voltage generator may use the VNEG voltage from voltage pump (330) to produce a word line voltage (VWL) ranging between 0V and VNEG. For example, in addition to VDAC 310 and switches SW1 and SW2, the WL voltage generator may include a pair of high voltage diode-connected N-channel (NHV) transistors. The VNEG voltage from voltage pump (330) is connected to the source of a first one of the serially-coupled NHV devices (NHV1). Switches controlled by metal options are placed between VNEG (Met OP_SW1), the drain terminal of the first NHV1 device (Met OP_SW2), and the drain terminal of the second NHV2 device (Met OP_SW3). Once a target VTP is determined, the VWL bias used to maintain the target VTP is set by activating one of the switches (e.g., Met OP_SW1, Met OP_SW2 or Met OP_SW3), so that a VWL voltage of VNEG, VNEG+VT(NHV) or VNEG+2*VT(NHV) may be supplied to the Row Decoder (150) and HV Isolation and VWL driver (160).

In one embodiment, a VWL bias of 0V may be supplied to the pass device of all 2T cells during program operations. However, such a bias is exemplary and may be different in other embodiments of the invention. In any case, the VWL bias applied to the WLs may be used to eliminate disturbs due to HV cycling. In one embodiment, the WL voltage may be set to VPWR for selected WLs and 0V for de-selected WLs during erase operations. Alternatively, the WL voltage used during erase may be floated or Hi-Z'd (i.e., set to a high impedance state). In the alternative embodiment, the WL would not be driven by the VWL circuit.

In some embodiments, the non-volatile memory array (110) shown in FIG. 1 may include one or more auxiliary rows (210). Auxiliary rows are rows that hold information outside of the declared density of the NV memory array (110) and are usually not accessible by users. In some embodiments, the auxiliary rows may be accessible to users if the lock-out signal (AXA) is enabled. The auxiliary rows (210) may be used to store a variety of information (e.g., process, lot, wafer, die, and configuration data) that may be set at the factory. More than one auxiliary row may be included, if much data is to be stored. Part or all of the auxiliary data may be loaded into volatile registers at power-up (POR, power-on-reset) to configure the memory for a particular application.

Auxiliary rows are implemented differently in the block and sector architectures. In the block architecture, the auxiliary rows span across multiple block sub-arrays. The auxiliary data stored in each block shares a P-well with other data in the block. When HV operations are performed on the data bytes in a block sub-array, the auxiliary rows within that sub-array may also be disturbed by high voltage (HV). The block architecture does not prevent the auxiliary rows from receiving HV biases. In the sector architecture, the auxiliary rows are confined to a single, dedicated sector. Confining the auxiliary rows to a dedicated sector prevents the auxiliary data from receiving HV biases when HV operations are performed on data stored within other sectors.

The manner in which data comes out of the array and connects to output circuitry is also different between block and sector architectures. In the block architecture, a separate column multiplexer (CMUX) is coupled to each block sub-array. The CMUX associated with a particular block connects the bit lines (e.g., BL_0 to BL_7) of that block to a plurality of sense amplifiers (SA) in the sense amp block (230). The architecture shown in FIG. 5 includes eight sense amplifiers in block (230), or one for each bit line included within a single block. During read operations, one CMUX (e.g., CMUX 220_0) is enabled for receiving a byte of data from a block sub-array (e.g., block 0). The data received from the block sub-array is routed to the sense amp block (230) via a data bus (CL[7:0]), which spans across the entire array. Each line in the CL bus connects a different bit line to a single SA in the SA block (230). For instance, BL [0] of each block sub-array is connected to CL [0], which in turn, connects to SA [0]. However, because, in this embodiment, only one CMUX is enabled at any given time, CL [0] connects to only one BL [0] in the block being read.

The sector architecture differs from the block architecture by grouping global bit lines (GBL) and using a dedicated column multiplexer (CMUX), column line (CL) and sense amp (SA) for each group of GBLs. Each SA is locally and electrically coupled to one group of GBLs through a dedicated CL and CMUX. The CMUX connects the CL to only one GBL in a group. In the sector architecture, each CL only spans across one group of GBLs, and not across the entire array as in the block architecture, in this embodiment. This reduces CL parasitic loading in the sector architecture.

Regardless of whether the SA block (230, FIG. 1) is utilized in a block or sector architecture, a sense amplifier in accordance with an embodiment of the present invention may include several features, which increase the reliability of systems using the NV memory architecture described herein. First, the sense amplifier may include a replica ISA_ref current path to allow adjustable magnitude and temperature compensation of the reference current (ISA_ref) used during reads. Second, a constant (with temperature) reference current (ITIM_ref) may be used to control sense amp timing. Third, a voltage limiting mechanism (280) may be used to prevent the BL voltage from exceeding VLIM during reads. Fourth, a FNPASS device may be included in the replica ISA_ref current path to enable low power supply (VPWR) operation. Fifth, a bypass circuit may be included for connecting the output of the SA to the input of the SA, thus allowing direct measurement of memory cell IV characteristics. A sense amplifier in accordance with an embodiment of the present invention may include one or more of the features presented herein. Further description is provided below.

As shown in FIG. 1, a reference current (IREF) generator (240) is included within the memory architecture for controlling the manner in which data is read from the NV memory array (110). The IREF generator block (240) provides two reference currents: a temperature compensated reference current (ISA_ref) and a constant with temperature reference current (ITIM_ref). The ISA_ref current is replicated in the SA $1^{st}$ stage and used for sensing. The ITIM_ref is used for generating clock signals, which are supplied to the sense amplifier to control sense amp timing.

Figure 9:
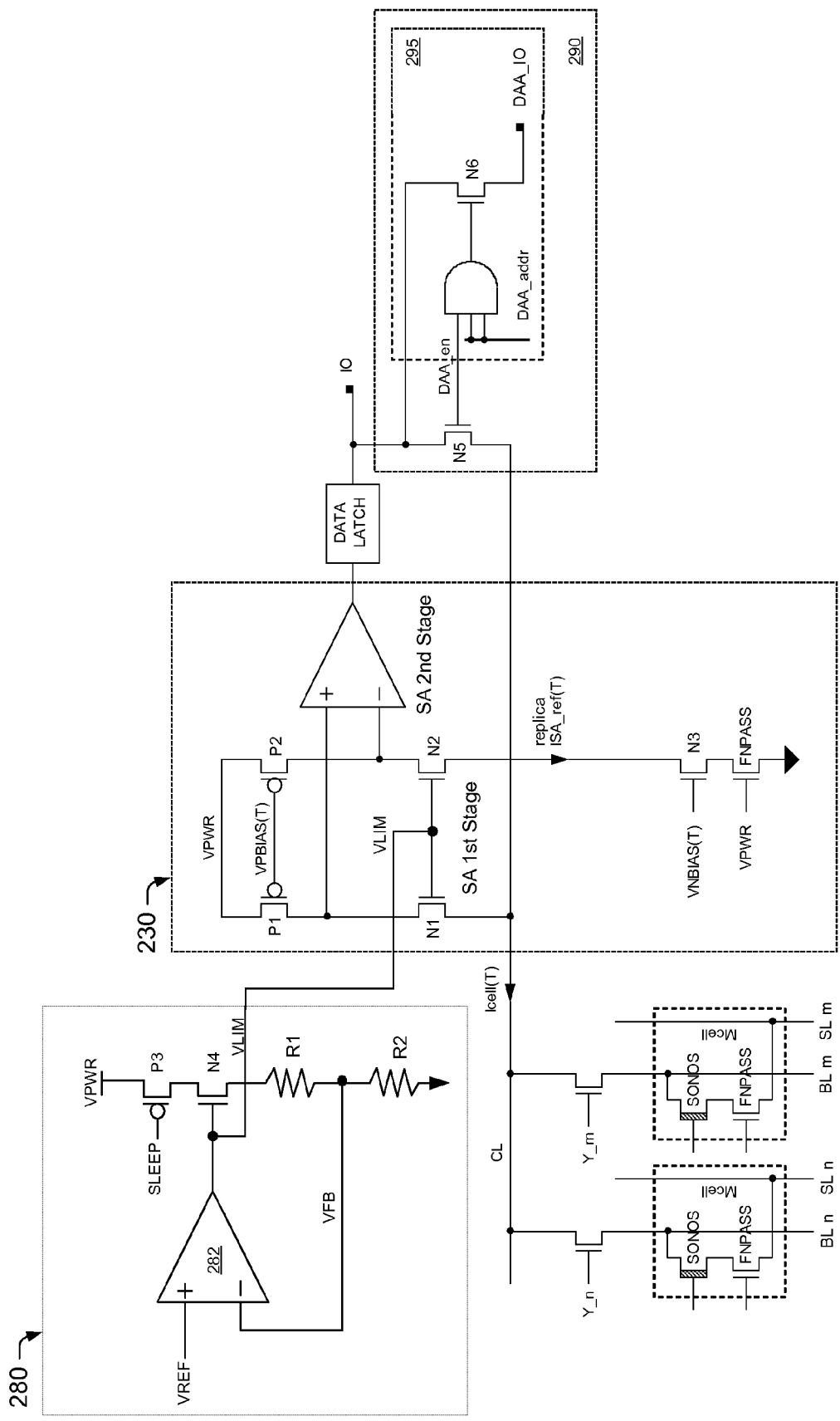
FIG. 9 is a circuit schematic depicting an embodiment of a sense amplifier (SA) that may be included in the NV memory architecture of FIG. 1. Circuit schematics depicting embodiments of a V_LIMIT generator, a pass device in the SA replica current path and a Direct Array Access (DAA) circuit are also shown in FIG. 9 to illustrate their relationship to the SA.

The ISA_ref current is supplied to the SA control block (250), where it is converted by a 1st SA Bias Generator (252) into a pair of voltage biases (VNBIAS, VPBIAS). As shown in FIG. 9, the VNBIAS and VPBIAS from SA control block (250) are supplied to the SA 1st stage to generate a replica of the ISA_ref current. In the embodiment of FIG. 9, the SA 1st stage includes two pairs of serially-coupled CMOS transistors (e.g., P1/N1 and P2/N2). The gates of the PMOS transistors (P1, P2) are coupled together for receiving VPBIAS. The gates of the NMOS transistors (N1, N2) are coupled together for receiving VLIM (described below). The source of transistor N1 is coupled for receiving the memory cell current (Icell). The source of transistor N2 is coupled to a replica current path comprising NMOS transistor N3. The gate of transistor N3 is coupled for receiving VNBIAS. In one embodiment, the replica current path may include an additional FNPASS device, as described in more detail below.

The SA 1st stage converts the memory cell current (Icell) and the replica ISA_ref current to voltages at the +/−inputs to the SA 2nd stage, where the differential voltages are compared to determine if '0' or '1' data is being read from a targeted memory cell. In one embodiment, the sense amplifier may sense '1' data if the memory cell current (Icell)<ISA_ref, and '0' data if the memory cell current (Icell)>ISA_ref. The data sensed by the SA block (230) is latched and supplied to an input/output (I/O) bus, which routes the data to external system components (via IO[N:0], FIG. 1).

Memory cell currents (Icells) tend to vary across process, voltage and temperature (PVT) corners. SONOS memory cell currents may exhibit significant variations in magnitude and temperature (i.e., slope). In some cases, the ISA_ref current may be adjusted to accommodate a wide range of memory cell currents. In other cases, the ISA_ref current may be adjusted to take advantage of memory cell IV characteristics that provide optimum data retention and HV endurance. In one embodiment, IREF generator block (240) may adjust the magnitude and/or slope of the ISA_ref current in accordance with values stored within a register block (260, FIG. 1).

For example, the magnitude of the ISA_ref current may be adjusted with a programmable value stored in IDAC [4:0]. In one embodiment, the IDAC [4:0] register may adjust the magnitude in increments of 0.6 uA. Alternative incremental adjustments may be used without departing from the scope of embodiments described herein. In some cases, the magnitude of the ISA_ref current may be adjusted to optimize data retention. If the SPC controller (described below) determines that a high memory cell current (Icell) provides optimum data retention, values stored within the IDAC [4:0] register may be increased to increase the magnitude of the ISA_ref current. Increasing the ISA_ref current enables the SA to sense the same memory cell erase-to-program current window, only at a higher level. If the ISA_ref current were left at a lower current level, a bigger VT window may be used and data retention could suffer.

The slope of the ISA_ref current may be additionally or alternatively adjusted with a programmable value stored in Slope [2:0]. In one embodiment, the Slope [2:0] register may adjust the slope in increments of 5 nA/° C. Alternative incremental adjustments may be used without departing from the scope of embodiments described herein. In some cases, the slope of the ISA_ref current may be adjusted to compensate for temperature variations in the memory cell current (Icell). Since ISA_ref is temperature dependent, the VNBIAS and VPBIAS signals, and thus, the replica ISA_ref current supplied to the SA block (230) are also temperature dependent. Adjusting the ISA_ref current in such a manner enables the reference current to track temperature variations in the memory cell current.

In addition to ISA_ref, the IREF generator block (240) generates a constant with temperature current reference, ITIM_ref, which controls SA timing. In one embodiment, the magnitude of the ITIM_ref current may be adjusted by applying one or more of the following inputs to the IREF generator block (240): ITIM [3:0], ITIMAUTO [3:0], AUTO_TIM and XTRM_TIM. As set forth below, the inputs may be set to increase or decrease the magnitude of ITIM_ref, thereby increasing or decreasing the sense time or access time of the NV memory block (110).

The biggest influence on memory speed is usually memory size or density. In one embodiment, the ITIM[3:0] and ITIMAUTO [3:0] values may be fixed by metal options (270), since the density of the memory array (110) is typically fixed for a given application. ITIM [3:0] defines a first memory speed (e.g., a non-automotive speed) at a temperature less than 100° C. ITIMAUTO [3:0] defines a second memory speed (e.g., an automotive speed) at a temperature less than 150° C. In order to allow higher temperature coefficients, the second memory speed is usually slower than the first memory speed.

The AUTO_TIM and XTRM_TIM inputs are used to select between the ITIM [3:0] and ITIMAUTO [3:0] values. When AUTO_TIM and XTRM_TIM are de-asserted, the magnitude of the ITIM_ref current is set by ITIM [3:0]. When AUTO_TIM is asserted and XTRM_TIM is de-asserted, the magnitude of the ITIM_ref current is set by ITIMAUTO [3:0]. ITIM [3:0] and ITIMAUTO [3:0] are ignored when XTRM_TIM is asserted. When XTRM_TIM is asserted, the magnitude of the ITIM_ref current is reduced below the automotive level. This further reduces memory speed so that reliable reads can occur during low power conditions like VPWR <1.6V.

Figure 10:
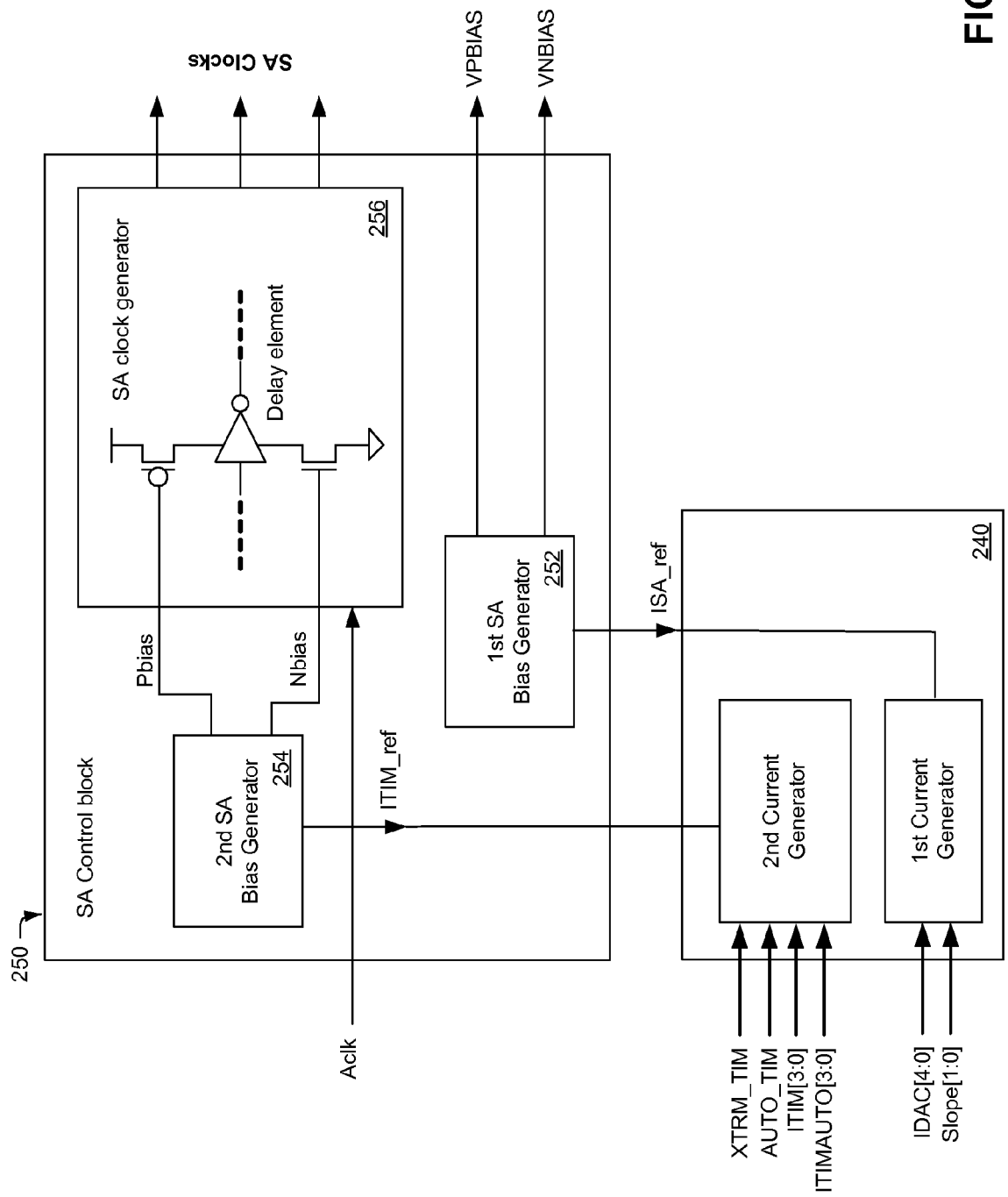
FIG. 10 is a block diagram depicting an embodiment of a SA control block that may be used to control SA timing, according to an embodiment.

The ITIM_ref current is supplied to SA control block (250), where it converted into internal clock signals used to control SA timing. For example, the SA control block (250) may couple a second bias generator block (254) to a SA clock generator block (256), as shown in FIG. 10. The SA bias generator block (254) uses the ITIM_ref current to generate internal bias signals (PBIAS and NBIAS). The PBIAS and NBIAS signals are responsive to the level of the ITIM_ref current. With ITIM_ref at a low level, PBIAS and NBIAS are less relative to VPWR and ground, respectively. This "starves" the timing chain within SA clock generator (256), resulting in slower SA clock signals. With ITIM_ref at a high level, PBIAS and NBIAS are more biased to VPWR and ground. This reduces timing delays through the chain, and thus, produces faster SA clock signals. The SA clock signals output from the timing chain are based on an input clock signal (ACLK) supplied to the memory architecture. The SA clock signals control timing of the pre-charge, equalization, 2nd stage enable and output latch within the SA.

As noted above, IDAC [4:0] and Slope [2:0] are programmable values, which are stored within register block (260) and used by IREF generator (240) to generate ISA_ref. In one embodiment (not shown in FIG. 1), the ITIM [3:0] and ITIMAUTO [3:0] values used to generate ITIM_ref may be programmable values stored within register block (260), instead of metal options set in option block (270). This would enable the magnitude of the ITIM_ref current to be altered for selecting a desired speed based on a given temperature range and/or memory density.

In one embodiment, one or more of the programmable values stored within register block (260) may be altered by a processor coupled to, or included within, the memory architecture. The System Performance Controller (SPC) shown in FIG. 1 embodies one such processor. In one embodiment, the one or more programmable values may be altered based on temperature. For instance, the SPC (350) may receive a temperature value (Temp_val) from a temperature sensor (360). The SPC may use the temperature value to adjust one or more of the programmable values, as discussed in more detail below.

An embodiment of an IREF generator, which uses feedback from a processor to generate adjustable magnitude and temperature reference currents, is described in a commonly assigned U.S. patent application Ser. No. 12/207,104 entitled "System to Adjust a Reference Current" and incorporated herein in its entirety. In some embodiments, the IREF generator (240) described herein in reference to FIG. 1 may be implemented in a manner similar to the IREF generator described in the commonly assigned application. For instance, the IREF generator described herein may use processor feedback to generate adjustable magnitude and temperature compensated ISA_ref currents. However, the IREF generator described herein is not limited to the implementation described in the commonly assigned patent application. For example, the IREF generator described herein differs from IREF generator described in the commonly assigned application by providing additional means for generating a constant (with temperature) reference current ITIM_ref, which is used for controlling sense amp timing.

In addition to disturbs due to HV cycling, SONOS 1T and 2T memory cells are disturbed during reads when selected BLs (or SBLs) are driven above a maximum allowable BL level (VLIM). As shown in FIG. 4, de-selected BLs are normally held at 0V. When a memory cell is selected for reading, a voltage (e.g., 1.2V) is driven from the SAs to the selected BLs. As shown in FIGS. 1 and 9, a VLIM level limiting mechanism (280) may be used to prevent the BL voltage from exceeding VLIM during reads. Limiting the BL voltage reduces the gate (WLS) to drain (BL or SBL) bias that could disturb the SONOS transistor after many read cycles.

An embodiment of a VLIM generator (280) is shown in FIG. 9. Although a particular embodiment is shown in the Drawings and described herein, one skilled in the art would understand how the VLIM generator could be implemented differently without departing from the scope of the embodiments described herein.

The VLIM generator shown in FIG. 9 is a closed loop circuit that uses a reference voltage (VREF) to generate a limited voltage (VLIM). In one embodiment, a stable VREF may be provided by a band-gap reference circuit. However, the circuit described herein is not so limited and may use other means for generating reference voltage in other embodiments. Op-amp (282) compares the VREF voltage to a feedback voltage (VFB) produced by a resistor-divider network (R1, R2). The resistor-divider network is coupled to a source terminal of a native high voltage N-channel device (N4). The drain terminal of device N4 is coupled to the drain terminal of a P-channel device (P3), which may be activated/de-activated (by SLEEP) for enabling/disabling the VLIM generator. P3, N4, R1 and R2 are coupled in series between VPWR and ground. The voltage generated between R1 and R2 is fed back to the op amp as the feedback voltage (VFB). The ratio of the R1 and R2 resistors is chosen to limit the VLIM voltage to a predefined maximum level (e.g., 1.2V). The output of the op amp (VLIM) is supplied to the gate terminal of device N4, as well as the gate terminal of the N-channel devices (N1, N2) included within the SA 1st stage.

As shown in FIG. 9, the VLIM generator and SA 1st stage use native (VT ~0V) N-channel high voltage devices (N4, N1, N2), configured as a source followers, to produce a maximum allowable BL voltage (VLIM) from the VPWR supply level. Driving the gate of the N1 device with VLIM ensures that the source terminals of the gate-connected N1 and N2 devices may be driven to approximately VLIM (since the VT of the N1 and N2 devices is ~0V). This limits the WLS to BL bias supplied by the CL and to the selected BL, eliminating disturbs on the same BL in an embodiment.

In one embodiment, an additional FNPASS device may be included within the replica ISA_ref current path of the SA. The FNPASS device included within the SA may be substantially identical to the FNPASS device included within the 2T SONOS memory cell (FIG. 2B). As shown in FIG. 9, the gate of the FNPASS device may be coupled to VPWR. This enables the replica ISA_ref current path to track VPWR, thus maintaining accurate sensing even at low VPWR levels (e.g., about 1.6V). In one embodiment, the VT of the FNPASS devices included within the memory cell and the SA 1st stage may be as high as 1.4V. If an FNPASS device were included in the memory cell, but not the SA 1st stage, sensing would fail at low VPWR levels because the memory cell current (Icell) would reduce (due to the high VT of the FNPASS device included within the 2T cell), but the replica ISA_ref current would not. Including the FNPASS device in the SA 1st stage enables the replica ISA_ref current to decrease in a similar fashion, so that sensing can occur at lower VPWR levels.

In one embodiment, a Direct Array Access (DAA) mode may be used to bypass the SA (while the SA is off) and connect the SA output path (I/O) directly to a column line (CL) connected to multiple column multiplexers (CMUX). Bypassing the SA allows memory cell IV characteristics to be directly measured when the CL is connected to a BL (through its normal decode path) and a specific row is enabled.

Figure 11:
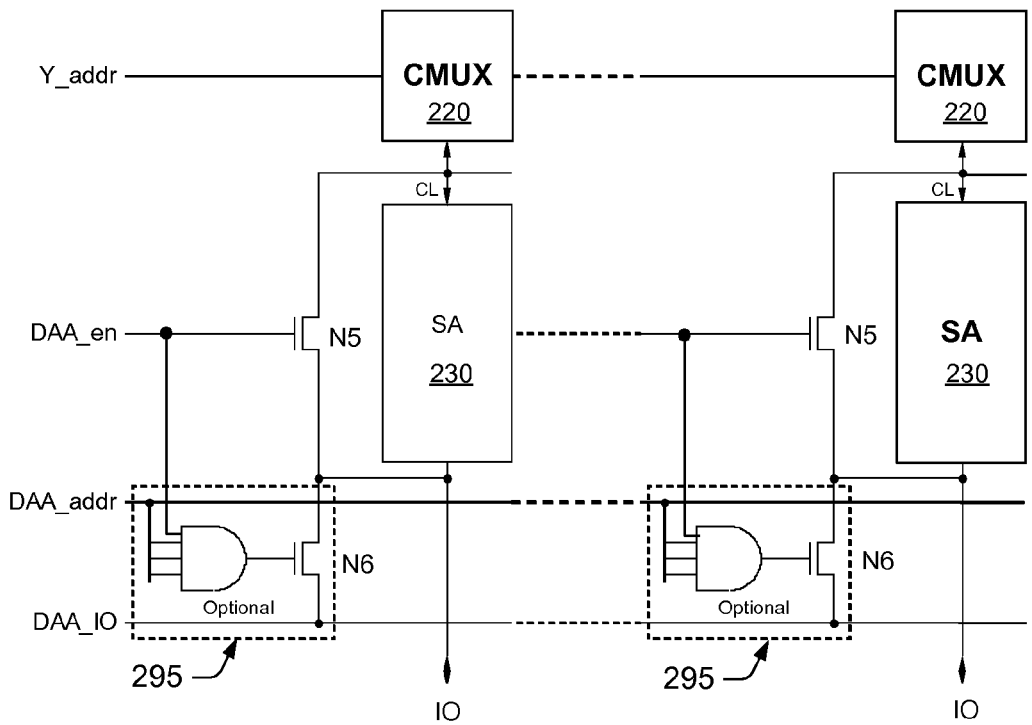
FIG. 11 is a block diagram illustrating the DAA circuit in more detail, according to an embodiment.

An embodiment of an exemplary DAA circuit (290) is shown in FIGS. 9 and 11. In the illustrated embodiment, an N-channel device (N5) is coupled between the SA output path (10) and the column line (CL) input to the SA. The DAA mode is enabled or disabled by a DAA_en signal supplied to the gate of the N5 device. When the DAA mode is enabled, the N5 device bypasses the SA and connects the IO path directly to the CL input. The CMUX decodes the CL down to a single BL in the memory array, so that each IO connects to only one BL in DAA mode, in an embodiment. To obtain IV characteristics from a particular memory cell, a bias of 0V may be applied to the WLS line (1T), and a bias of VPWR may be applied to the WL line (2T) of the memory array, enabling each IO path to connect to a single memory cell.

In one embodiment, an optional 10 decoder circuit (295) can be added to decode all IOs down to a single DAA_IO line. In the embodiment of FIGS. 9 and 11, optional decoder circuit (295) includes a multi-input AND gate and N-channel device (N6). The inputs of the AND gate are coupled for receiving the DAA_en signal and a plurality of address signals from a DAA_addr bus. The output of the AND gate is coupled to the gate of the N6 device. When DAA_en and DAA_addr are enabled, the N6 device bypasses the SA IO path and connects the CL input directly to DAA_IO. In some cases, an optional IO decoder circuit (295) may be included for each SA. The optional circuits may decode the IOs from all SAs down to a single DAA_IO line, enabling system or tester resources to be minimized.

The DAA mode shown in FIGS. 9 and 11 provides one way for measuring memory cell IV characteristics. In some embodiments, memory cell IV characteristics may be additionally or alternatively obtained through a Test Mode Interface block (300). As shown in FIG. 1, the Test Mode Interface block (300) may receive analog inputs from Test_Pad1, Test_Pad2 and Margin Voltage DAC (VDAC, 310). In some embodiments, the analog inputs from the test pads or the VDAC may be routed to a WLS line (1T or 2T) of the memory array. Unlike the DAA mode, which obtains IV characteristics at WLS=0V, supplying analog inputs to the Test Mode Interface block (300) enables IV characteristics to be obtained across a wide range of WLS potentials. This enables a whole family of IV curves to be obtained.

A processor, referred to as the System Performance Controller (SPC), is included for controlling many features and functions of the NV memory architecture described herein. For example, the SPC (350) controls whether a read, erase or program operation is performed by supplying an appropriate mode control (Mode [3:0]) signal to Mode Control block (370). The Mode [3:0] inputs are clocked into the Mode Control block (370) with the Aclk signal. Based on the value of the Mode [3:0] signal, the Mode Control block (370) may supply a READ signal to the SA Control block (250) or a ERS/PRG signal to the HV Control block (120). If a program operation is to be performed, the PRG signal is routed to the BL Voltage Generator (380). The Mode [3:0] input may also be used to configure the NV memory array (110) for block or sector operations including, byte, page, bulk sector, bulk all erase/program, and HV page latch reset. In addition to controlling the mode, a Seq [1:0] input may be supplied to the Mode Control block (370) to control the sequencing of the HV operations.

The SPC (350) also controls margin mode (MM) reads conducted on the NV memory array (110). MM reads are normal reads through the SA path except that the SONOS gate is driven to VMARG (instead of 0V). As such, a gate-to-source voltage (VGS) of VMARG is supplied to the SONOS device during margin mode reads. The margin voltage is provided by VDAC circuit 310. As set forth below, the SPC supplies input signals (PNB, MDAC [7:0]) to the VDAC for controlling the polarity and magnitude of the margin voltages (VMARG) generated thereby.

In some embodiments, SPC (350) may initiate a margin mode read of the memory array to determine if target VTE (SONOS erase VT) and target VTP (SONOS program VT) values are met during erase/program operations. For example, erased SONOS devices have mainly negative VTs (called VTEs) and programmed SONOS devices have mainly positive VTs (called VTPs). In some cases, a negative margin mode read may be initiated to determine if a target VTE that avoids over-erasure has been met. Although there is no over-program issue to worry about, a positive margin mode read may be initiated to determine if a target VTP has been met.

SPC (350) initiates positive and negative margin mode reads by supplying an appropriate PNB signal to the pump control (340) and Margin Voltage DAC (VDAC, 310) blocks. The PNB signal controls whether a positive or negative margin mode read should be performed, and thus, controls which voltage pumps (320, 330) are turned on for the margin mode read. In general, the VPOS pump is turned on during positive margin mode reads, and the VNEG pump is turned on during negative margin mode reads. However, both VPOS and VNEG pumps could be activated at the same time when more than one test mode is enabled (e.g., if negative margin and DAA modes are enabled at the same time).

Figure 13:
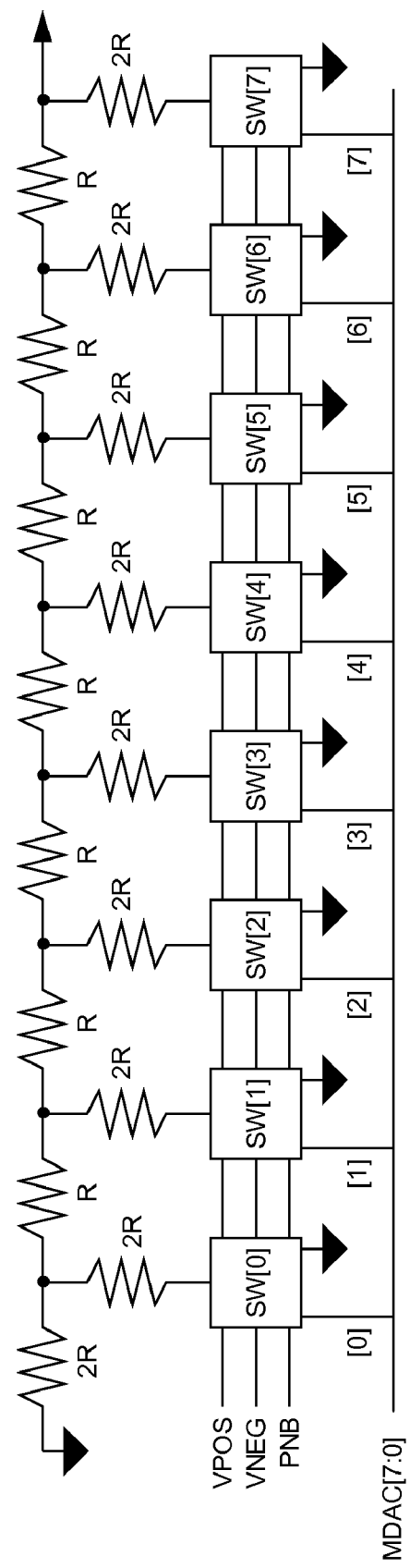
FIG. 13 is a circuit schematic depicting an embodiment of a Margin Voltage DAC (VDAC) that may be included in the NV memory architecture of FIG. 1.

During margin mode reads, VDAC (310) generates a margin voltage (VMARG), which is routed through the Test Mode Interface block (300), the HV Control block (120) and the HV Row block (130) to the gates of the SONOS transistors. The level of VMARG is set by the MDAC [7:0] and PNB signals supplied to the VDAC from the SPC. In one embodiment, VMARG may be derived by an R-2R ladder and switch network, as shown in FIG. 13.

In addition to the PNB and MDAC [7:0] signals from SPC (350), the R-2R ladder and switch network receives the VPOS and VNEG signals from voltage pumps (320 and 330). In one embodiment, VDAC (310) may use the input signals to generate 256 VMARG levels ranging between 0V and VPOS for positive margin reads, or between 0V and VNEG for negative margin reads. VMARG levels outside of the 0V to VPWR range may be used to detect memory cell threshold voltages ($V_ts$), which fall outside of the power rails.

When PNB=1, the pump control circuit (340) routes an enable signal (ENPOS) to VPOS voltage pump (320), causing pump (320) to supply VPOS to the R-2R ladder and switch network. This enables VDAC (310) to generate 256 positive margin voltages (VMARG) within the range of 0V to VPOS.

The MDAC [7:0] input is altered for supplying increasingly positive margin voltages to the memory array until "all pass" and "all fail" points are found. The pass/fail points may be observed through Test Mode Interface block (300). For instance, the Test Mode Interface block (300) may route increasingly positive VMARG values to the memory array (via VMARG_int). The threshold voltages ($V_t$s) resulting from VMARG are observed through the Test Mode Interface block. If the measured $V_t$ causes all memory cells to pass (i.e., no cells conduct current), the $V_t$ associated with that margin voltage is determined to be the worst case VTP (VTP_wc). The next highest VMARG setting that causes all memory cells to fail (i.e., all cells conduct current) is determined to be the best case VTP (VTP_bc).

When PNB=0, the pump control circuit (340) routes an enable signal (ENNEG) to VNEG voltage pump (330), causing pump (330) to supply VNEG to the R-2R ladder and switch network. This enables VDAC (310) to generate 256 negative margin voltages (VMARG) within the range of 0V and VNEG. The MDAC [7:0] input is altered for supplying increasingly negative margin voltages to the memory array until "all pass" and "all fail" points are found. The pass/fail points may be observed through Test Mode Interface block (300). For instance, the Test Mode Interface block may route increasingly negative VMARG values to the memory array (via VMARG_int). The threshold voltages ($V_t$s) resulting from VMARG are observed through the Test Mode Interface block. If the measured $V_t$ causes all memory cells to pass, the $V_t$ associated with that margin voltage is determined to be the worst case VTE (VTE_wc). The next lowest VMARG setting that causes all memory cells to fail is determined to be the best case VTE (VTE_bc).

The SPC (350) also controls the algorithms used to reliably write (erase and program) SONOS 1T and 2T memory cells, so as to meet data retention and endurance requirements. These algorithms, referred to as "smart write algorithms," are discussed in more detail in commonly assigned Provisional Patent Application Ser. No. 61/122,805 entitled "Intelligent Method of Writing a Nonvolatile Memory Array." An overview of the smart write algorithms used by SPC (350) is provided below. Further description of the algorithms may be found in the commonly assigned provisional patent application, the description of which is incorporated herein in its entirety.

The "smart write algorithms" used by SPC (350) may, in embodiments, maximize data retention and endurance cycling by avoiding saturation of the SONOS erase $V_t$ (VTE) across process and temperature corners. VTE saturation is avoided by performing several steps. First, the nonvolatile memory array is characterized (typically during manufacturing) to determine the inputs that should be used to reliably write to the nonvolatile memory array. The inputs include the values stored within register block (260) and are based on the target VTE and VTP values found during initial margin mode reads. In addition to array characterization, a pre-programming step is conducted prior erasing to shift the VTE of any erased transistors toward the programmed state. This avoids erase saturation on subsequent erases by preventing over-erasure.

Figure 12:
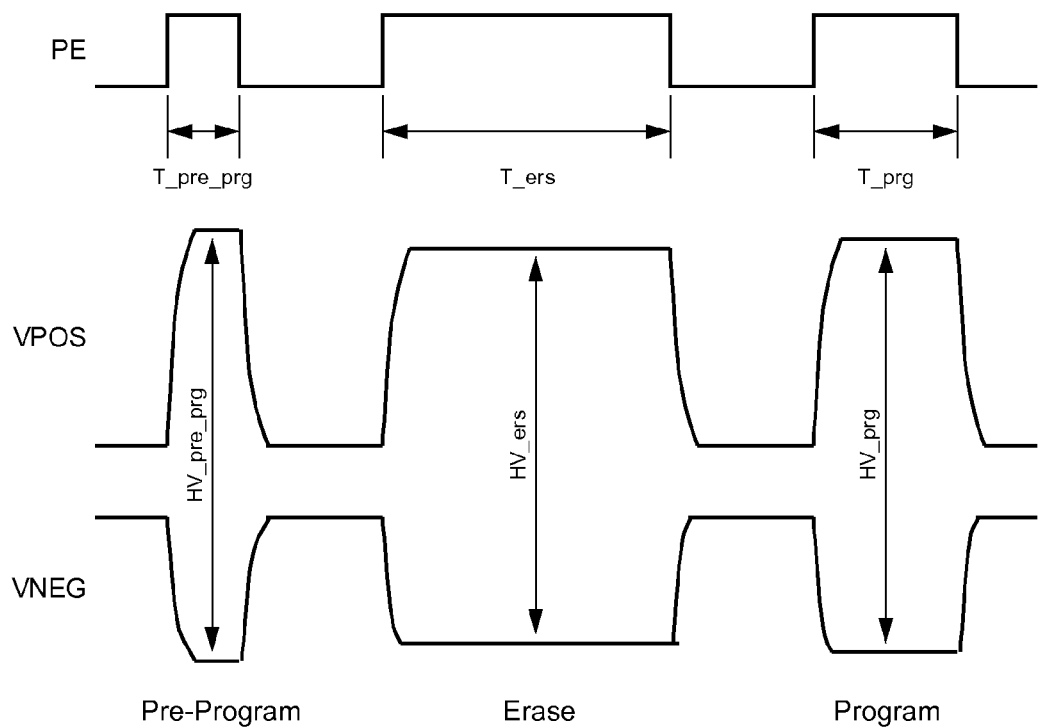
FIG. 12 shows that the magnitude and duration of the high voltage biases supplied to the NV memory array during pre-program, erase and program operations may be adjusted, according to an embodiment.

In an embodiment, the SPC initially pre-programs all target memory cells so that a subsequent erase may not over-erase memory cells that were already erased. As shown in FIG. 12, the pre-program signal is typically of short duration (e.g., <1 msec), but high programming voltage (e.g., >10.5V). As described in more detail below, SPC (350) controls the duration and magnitude of the pre-program signal by supplying appropriate signals to pump control block (340), as well as voltage pumps (320 and 330). In addition to process corners, SPC (350) may adjust the duration and/or magnitude of the pre-program signal to compensate for changes in temperature. In one embodiment, temperature adjustment may be based on the Temp_val signal received from Temperature Sensor (360).

The SPC performs various steps to characterize the memory array and determine the inputs used to obtain target VTE and VTP values. Before an erase occurs, the SPC may initiate a positive margin mode read to locate the memory cell with the best case VTP (VTP_bc), since the memory cell with the best case VTP may most likely have the worst case VTE (VTE_wc). A first erase cycle of short duration (e.g., 1 msec) is conducted to establish an initial erase voltage threshold. After the erase, the $V_t$ of the memory cell having the best case VTP is measured (using margin mode, for example) to establish a first worst case VTE (VTE_wc1). A second erase cycle, identical to the first, is conducted to establish a second erase voltage threshold. The resulting $V_t$ is measured after the second erase (again, using margin mode) to establish a second worst case VTE (VTE_wc2).

The measured VTE_wc1 and VTE_wc2 values are used along with the erase cycle time (e.g., 1 msec) to calculate the erase speed. The worst case VTE from the second erase (VTE_wc2) is compared to the target VTE level determined, e.g., during an initial margin mode read, as discussed above. The erase speed may be used along with the difference between VTE_wc2 and the target VTE level to calculate the erase pulse width used to drive all bits of the NV memory array to the target VTE level, in an embodiment. The target VTE is typically the highest or most positive $V_t$ of all erased memory cells (i.e., the VTE of all other memory cells may be larger in magnitude, and thus, more negative) in an embodiment. A third erase cycle is conducted using the erase pulse width calculated above to move the $V_t$ of all memory cells to the target VTE level, in an embodiment. The resulting $V_t$ is measured and compared to the target VTE level. If the measured $V_t$ is within expectations, the erase pulse width mentioned above may be used in subsequent erase operations.

A similar algorithm may be used for determining an appropriate program pulse width. The programming algorithm differs from the erase algorithm by monitoring the memory cell with the best case VTE (VTE_bc), since this memory cell may most likely have the worst case VTP (VTP_wc). After the third erase cycle is conducted (as discussed above), the $V_t$ of the memory cell having the best case VTE is measured and compared to the target VTP. In one embodiment, a program pulse width associated with the target VTP (and determined during an initial margin mode read) may be used in subsequent programming operations, if the $V_t$ measured after the third erase cycle is within expectations. In an alternative embodiment, the SPC may simply use a long programming pulse width, which guarantees a sufficiently positive VTP.

Over-programming is not an issue. However, there is one consideration that may be taken into account when programming. As noted above, all inhibited memory cells (i.e., erased cells) are given a soft program bias (i.e., the VBL inhibit bias shown in FIG. 4) during program operations, in an embodiment. This bias may slightly elevate the VTE of the inhibited memory cells, so the VTE_wc should be checked to ensure that it is still negative with margin for data retention.

As noted above, the memory architecture described herein uses dual voltage pumps (VPOS pump 320 and VNEG pump 330) to perform HV pre-program, erase and program operations. When VPOS and VNEG are applied directly to the SONOS 1T or 2T memory cells, the HV biases are applied in such a way that the sum of the magnitudes of VPOS and VNEG create the HV biases used for pre-program, erase and program. As described in more detail below, SPC (350) controls the magnitude and duration of the VPOS and VNEG signals generated by voltage pumps (320, 330) based on the operation being performed. In some cases, the VPOS and VNEG signals may also be adjusted to compensate for temperature.

As shown in FIGS. 1 and 12, the magnitude of the VPOS and VNEG signals are independently controlled with the PDAC [4:0] and NDAC [4:0] values, which are set by SPC (350) and stored within register block (260). In one embodiment, the PDAC [4:0] register may provide a VPOS range of about 4.3V to 7.4V, while the NDAC [4:0] register provides a VNEG range of about −1.4V to −4.5V. Alternative voltage ranges may be used in other embodiments. The PDAC [4:0] and NDAC [4:0] values are supplied to the VPOS and VNEG voltage pumps to set the magnitude of the VPOS and VNEG signals. The SPC (350) sets the magnitude of the VPOS and VNEG signals based on the HV operation (pre-program, erase or program) being performed. In one embodiment, a VPOS of about 6V and a VNEG of about −4V may be applied to the terminals of the SONOS device to provide a +10V programming voltage or a −10V erase voltage. Alternative values of VPOS and VNEG may be used in other embodiments.

In addition to magnitude, SPC (350) controls the duration of the VPOS and VNEG signals generated by voltage pump circuits (320, 330). As shown in FIGS. 1 and 12, SPC (350) supplies a pump enable (PE) signal to the pump control block (340), which in turn, generates a Pump signal for enabling the VPOS (320) and VNEG (330) voltage pumps at the same time. The duration of the PE signal (and thus, the duration of the Pump signal) can be set differently for each function of pre-program, erase and program. In one embodiment, a relatively short PE duration (T_pre_prg) may be used to pre-program, a somewhat longer PE duration (T_prg) may be used to program, and an even longer PE duration (T_ers) may be used to erase, as shown in FIG. 12. The duration of the program and erase signals (i.e., the T_prg and T_ers pulse widths) may be determined by the smart write algorithms described above and in the commonly assigned application.

In addition, the VPOS and VNEG signals may be adjusted to compensate for variations in temperature. For example, HV program and erase operations are typically slower at cold temperatures and faster at hot temperatures. To compensate for temperature, SPC (350) may use the Temp_val received from Temperature Sensor (360) to independently adjust the PE duration and/or the values stored within the PDAC [4:0] and NDAC [4:0] registers for each HV operation. Such adjustment would enable the memory architecture described herein to meet write speed requirements, even in the midst of temperature variation.

From the description provided above, it is clear that many settings are used to configure the NV memory array (110). Some of the configuration settings are controlled by SPC (350) and stored within configuration registers (260). Storing configuration settings in a register block (260) enables the settings to be adjusted (e.g., to account for process and/or temperature variations), so that correct settings may be applied to the memory array at each power-on-reset (POR). In one embodiment, adjustable configuration settings may include the IDAC [4:0] and Slope [2:0] settings supplied to the IREF generator (240), the BDAC[3:0] setting supplied to the BL Voltage generator (380), and the PDAC[4:0], NDAC [4:0] and PE settings supplied to the pump control block (340) and voltage pumps (320, 330).

Configuration settings, which are used at POR for NV memory reads but do not change with process or temperature, can be placed as metal options. Examples of non-adjustable configuration settings may include the ITIM [3:0] and ITIMAUTO [3:0] signals supplied to option block (270). No adjustment may be necessary, as these signals may be based on a fixed memory density. In some embodiments, the memory architecture may be designed to meet the requirements of more than one specification (such as industrial and automotive specifications) and/or to maintain reliable operation under extreme conditions (like low VPWR or high temperature). For example, the AUTO_TIM and XTRM_TIM signals can be adjustable configuration settings that are applied on POR. The AUTO_TIM signal can be adjusted to meet industrial or automotive specifications by selecting a particular memory speed, as discussed above. In addition, the XTRM_TIM signal can be adjusted to ensure reliable memory reads under extreme conditions.

In some embodiments, SPC (350) may control other features and functions of the NV memory architecture in addition to those described above. For example, SPC (350) may control the test modes performed by Test Mode Interface block (300) by applying an appropriate test mode (e.g., TM [2:0]) signal thereto. A different TM [2:0] signal may be supplied to the interface block to perform margin mode reads or characterization of the VWL level. Another TM [2:0] signal may force analog signals into the memory array, if initial analog levels are wrong or if other analog levels are desired. Signals supplied to the Test Mode Interface (e.g., VPOS, VNEG, VMARG and other analog signals from the array) may be observed outside of the memory architecture through I/O pins Test_Pad1 and Test_Pad2.

It will be appreciated to those skilled in the art having the benefit of this disclosure that this application provides a non-volatile memory architecture. Further modifications and alternative embodiments of various aspects of the invention will be apparent to those skilled in the art in view of this description. It is intended, therefore, that the following claims be interpreted to embrace all such modifications and changes and, accordingly, the specification and drawings are to be regarded in an illustrative rather than a restrictive sense.

What is claimed is:

1. A memory architecture, comprising:
    an array of non-volatile memory cells arranged in rows and columns;
    a sense amplifier coupled to at least one column within the array for sensing a data bit stored within one of the non-volatile memory cells; and
    a reference current generator configured to provide:
        a first reference current having adjustable magnitude and adjustable slope, wherein the first reference current is supplied to the sense amplifier for sensing the data bit; and
        a second reference current having adjustable magnitude and constant slope, wherein the second reference current is supplied to a control block for generating clock signals used to control sense amplifier timing.

2. The memory architecture recited in claim 1, wherein the magnitude of the second reference current has a first mode where the magnitude is increased for increasing the frequency of the clock signals and has a second mode where the magnitude is decreased for decreasing the frequency of the clock signals.

3. The memory architecture recited in claim 2, wherein the magnitude of the second reference current is selected based on a size of the non-volatile memory array.

4. The memory architecture recited in claim 2, wherein a value corresponding to the magnitude of the second reference current is set by a metal option.

5. The memory architecture recited in claim 1, further comprising a plurality of registers coupled for storing configuration values, which are used by the reference current generator for setting the magnitude and slope of the first reference current.

6. The memory architecture recited in claim 5, wherein the plurality of registers further comprise a configuration value for setting the magnitude of the second reference current.

7. The memory architecture recited in claim 6, further comprising a processor coupled for altering the configuration values stored within the plurality of registers based on a temperature value received from a temperature sensor.

8. A memory architecture, comprising:
   a memory array comprising a plurality of memory cells coupled to bit lines;
   a sense amplifier comprising a first stage, which is coupled for receiving a first reference current from a reference current generator and a read current from one of the bit lines; and
   a voltage limiting circuit coupled to the first stage of the sense amplifier for limiting a read voltage supplied to the one bit line, wherein the voltage limiting circuit is coupled for supplying a closed loop reference voltage to the first stage of the sense amplifier.

9. The memory architecture recited in claim 8, further comprising the reference current generator, wherein the reference current generator is configured for:
   generating the first reference current with adjustable magnitude and adjustable slope; and
   generating a second reference current with adjustable magnitude and constant slope.

10. The memory architecture recited in claim 8, wherein the sense amplifier comprises a second stage, which is coupled for sensing a stored data bit by comparing a first voltage corresponding to the read current to a second voltage corresponding to the reference current.

11. The memory architecture recited in claim 8, wherein the closed loop reference voltage limits the read voltage supplied to the one bit line to a maximum level determined by comparing a reference voltage to a feedback voltage generated by a resistor divider network.

12. The memory architecture recited in claim 8, wherein the first stage of the sense amplifier comprises:
   a first pair of p-channel and n-channel transistors coupled in series between a power supply node and a column line coupled to the one bit line; and
   a second pair of p-channel and n-channel transistors coupled in series between the power supply node and ground.

13. The memory architecture recited in claim 12, wherein the closed loop reference voltage is supplied to mutually-coupled gate terminals of the n-channel transistors in the first and second pair.

14. The memory architecture recited in claim 12, wherein the first stage of the sense amplifier further comprises a pass transistor coupled between the second pair of transistors and ground, wherein the pass transistor is identical to a pass transistor included within each memory cell, and wherein the gate terminal of the pass transistor included within the first stage of the sense amplifier is coupled to the power supply node.

15. The memory architecture recited in claim 12, further comprising a Direct Array Access (DAA) circuit coupled for connecting an output terminal of the sense amplifier directly to the column line, thus enabling a path through the sense amplifier to be bypassed during DAA modes.

16. A method for reading a data bit stored within a memory array, the method comprising:
   supplying a voltage bias to a bit line of the memory array for generating a read current associated with the stored data bit;
   limiting the voltage bias to a maximum value, so as to limit the read current;
   supplying a first reference current with adjustable magnitude and adjustable slope to a sense amplifier coupled to the bit line;
   comparing the limited read current to the first reference current to read the stored data bit and
   supplying a second reference current to a control block for generating clock signals used to control sense amplifier timing.

17. The method as recited in claim 16, further comprising adjusting the magnitude and slope of the first reference current to track variations in the read current due to variations in one or more of process, voltage and temperature (PVT).

18. The method as recited in claim 16, further comprising adjusting a magnitude of the second reference current to increase or decrease a frequency of the clock signals.

* * * * *